(12) United States Patent
Lopez Julia et al.

(10) Patent No.: US 11,743,989 B2
(45) Date of Patent: Aug. 29, 2023

(54) VOLTAGE SUPPLY AMPLITUDE MODULATION DRIVING OUTLIER MICROLEDS

(71) Applicant: Lumileds LLC, San Jose, CA (US)

(72) Inventors: Antonio Lopez Julia, Vaals (NL); Zhi Hua Song, Palo Alto, CA (US)

(73) Assignee: Lumileds LLC, San Jose, CA (US)

( * ) Notice: Subject to any disclaimer, the term of this patent is extended or adjusted under 35 U.S.C. 154(b) by 433 days.

(21) Appl. No.: 17/123,010

(22) Filed: Dec. 15, 2020

(65) Prior Publication Data
US 2022/0191987 A1    Jun. 16, 2022

(51) Int. Cl.
*H05B 45/325* (2020.01)
*H05B 45/34* (2020.01)
*H05B 45/44* (2020.01)

(52) U.S. Cl.
CPC ........... *H05B 45/325* (2020.01); *H05B 45/34* (2020.01); *H05B 45/44* (2020.01)

(58) Field of Classification Search
CPC ...... H05B 45/325; H05B 45/34; H05B 45/44; H05B 47/11; H05B 47/115; G09G 3/30;
(Continued)

(56) References Cited

U.S. PATENT DOCUMENTS 8,120,555 B2    2/2012  Cok
10,734,897 B2   8/2020  Petersen
(Continued)

FOREIGN PATENT DOCUMENTS

KR    20070049735 A    5/2007
WO    WO-2020/004705 A1    1/2020

OTHER PUBLICATIONS

"International Application Serial No. PCT/US2021/061260, International Search Report dated Mar. 31, 2022", 7 pgs.
(Continued)

*Primary Examiner* — Renan Luque
(74) *Attorney, Agent, or Firm* — Schwegman, Lundberg & Woessner, P.A.

(57) ABSTRACT

A micro light emitting diode (LED) die can include a matrix of micro LEDs with a variety of forward voltages. A method of reducing a number of undriven or under driven uLEDs can include providing, by a power supply, an alternating current voltage ($V_{LED}$) with a minimum voltage ($V_{MIN}$) and a maximum voltage ($V_{MAX}$), $V_{MIN}$ being sufficient to drive a plurality of micro light emitting diodes (uLEDs) of a uLED die using a plurality of uLED drivers, identifying, by a controller coupled to the uLED drivers, a uLED of the plurality of uLEDs with a forward voltage ($V_f$) greater than $V_{MIN}$, and altering, by the controller, a time of a rising edge of a pulse width modulation (PWM)-on time of the uLED such that $V_f$ of the uLED is less than $V_{LED}$ for the PWM-on time.

20 Claims, 19 Drawing Sheets

(58) Field of Classification Search
CPC ............ G09G 2330/028; H01L 25/075; H01L 27/156
See application file for complete search history.

(56) References Cited

U.S. PATENT DOCUMENTS

| | | |
|---|---|---|
| 2006/0022214 A1 | 2/2006 | Morgan et al. |
| 2011/0156593 A1 | 6/2011 | De Greef et al. |
| 2011/0248648 A1* | 10/2011 | Liu ........................ H05B 45/14 315/246 |
| 2017/0295618 A1* | 10/2017 | Dann ...................... H05B 45/48 |
| 2019/0147793 A1 | 5/2019 | Valentine |
| 2020/0084868 A1 | 3/2020 | Bonne |
| 2020/0220377 A1 | 7/2020 | Chen |

OTHER PUBLICATIONS

"International Application Serial No. PCT/US2021/061260, Written Opinion dated Mar. 31, 2022", 3 pgs.

* cited by examiner

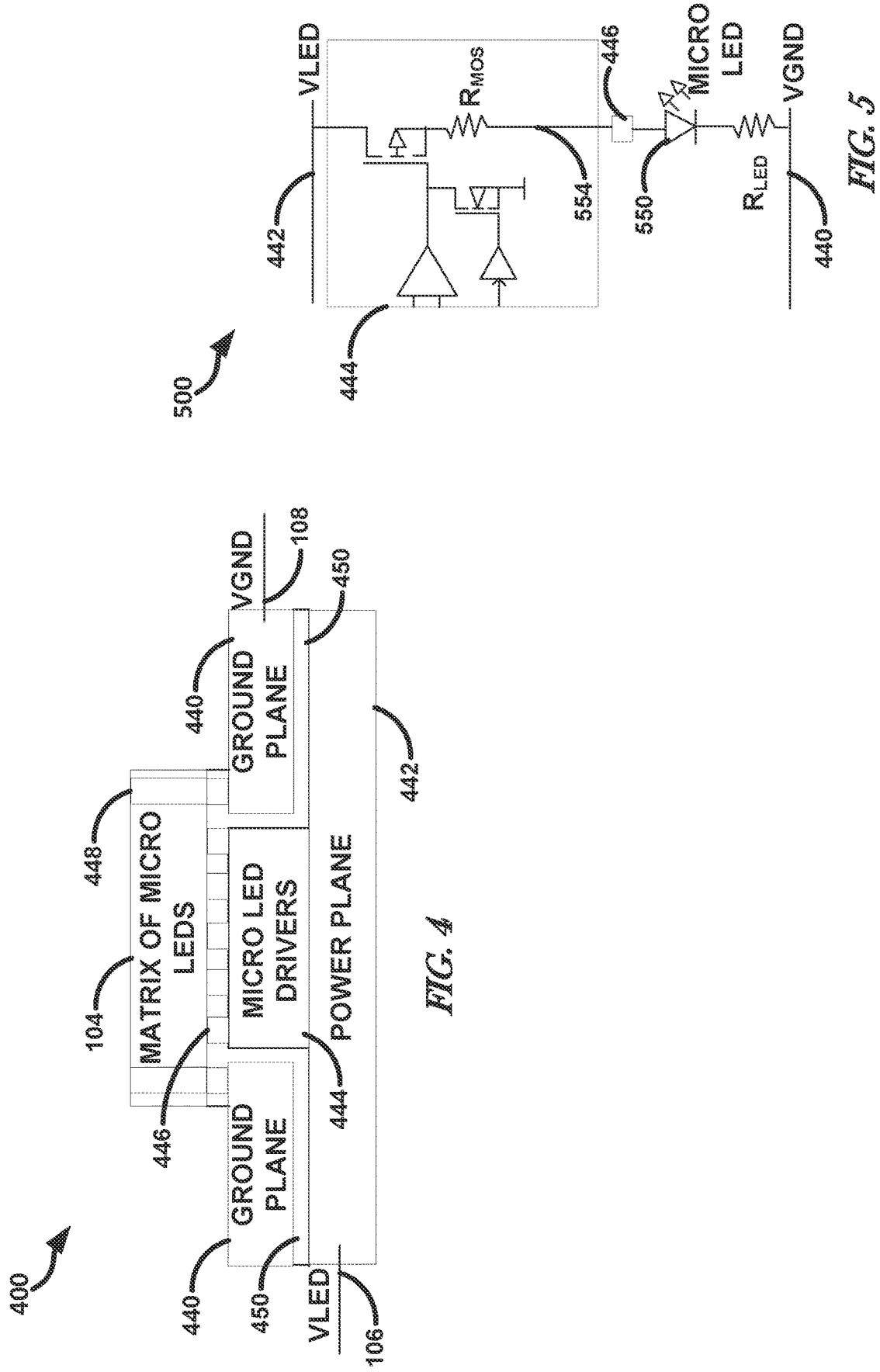

VOLTAGE SUPPLY AMPLITUDE MODULATION DRIVING OUTLIER MICROLEDS

TECHNICAL FIELD

The present disclosure relates to a light-emitting apparatus and a light-emitting apparatus control system configured to reduce or eliminate dark aberrations experienced with an abnormally high forward voltage.

BACKGROUND

In some applications, such as home or commercial lighting, user experience of the lighting is very important. Automotive lighting is another application in which user experience is very important. If a forward voltage of a light emitting diode (LED) is above the supply voltage, the LED will likely not operate as expected. Such LEDs can appear as black or darker spots among lit LEDs.

BRIEF DESCRIPTION OF THE DRAWINGS

The figures show various views of an apparatus, system, or method, including a control system that can alter light emerging from one or more light emitting diodes (LEDs), in accordance with some embodiments. The terms "front," "rear," "top," "side," and other directional terms are used merely for convenience in describing the apparatuses and systems and other elements and should not be construed as limiting in any way.

FIG. 4 illustrates, by way of example, a conceptual block diagram of an embodiment of a package including a matrix of uLEDs and corresponding driver circuitry.

FIG. 5 illustrates, by way of example, a circuit diagram of an embodiment of a uLED pixel (uLED driver circuitry and a corresponding uLED).

DETAILED DESCRIPTION

Figure 1:
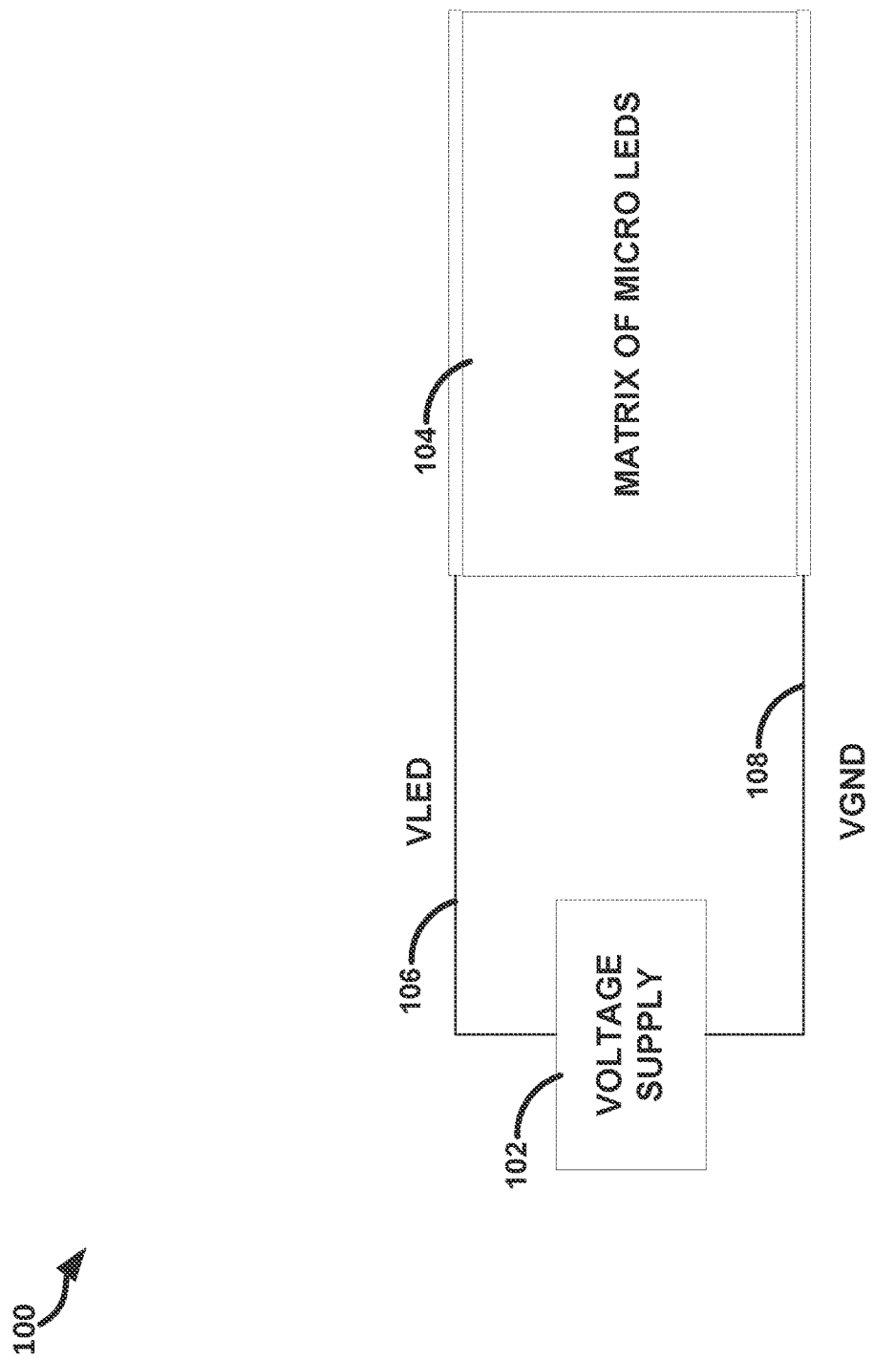
FIG. 1 illustrates, by way of example, a logical block diagram of an embodiment of a system for driving a die including a matrix of micro LEDs (uLEDs).

Compact, pixelated LEDs, such as in an array of micro LEDs (sometimes presented as "uLED") on a uLED die, can include a large monolithic area. The uLED array can be used for automotive lighting, such as headlights, taillights, parking lights, fog lamps, direction lights, or the like. Such applications are merely examples and many other applications of uLED arrays are possible.

The uLED array can include a die of uLEDs hybridized with driver electronics for the control of individual pixel brightness. The driver electronics can be manufactured using, for example, complementary metal oxide semiconductor (CMOS) materials or processes or other semiconductor manufacturing processes.

In some embodiments, the driver electronics can implement a linear driving scheme. The linear driving schemes are practical solutions for such control electronics, particularly for large uLED array configurations. However, special care is demanded in a linear driving scheme to control the voltage supply to the driver electronics, such as to provide both stable uLED current supply and acceptable heat losses. To guarantee that all pixel drivers are operated above their compliance voltage, the voltage supply to the driver electronics is generally set above the highest forward voltage ($V_f$) of the uLEDs in the array.

An advantage of monolithic uLED chips is that they favor a narrow dispersion of forward voltages ($V_f$) among the uLED population (e.g., standard deviations <100 milli-Volts). This forward voltage ($V_f$) homogeneity reduces heat loss, such as by reducing a voltage difference between a voltage supplied and the forward voltage ($V_f$) of the uLEDs. Unfortunately, there still exists a small but relevant group of outlier uLEDs whose forward voltage ($V_f$) is excessively high (e.g., greater than 20%, 25%, a greater or lesser percentage, or a percentage therebetween higher than the average forward voltage ($V_f$) of the uLEDs).

One solution to providing sufficient supply voltage includes providing a supply voltage that is greater than (or equal to) a highest $V_f$ for all of the uLEDs on the die, including the outliers. Using this solution, all uLEDs, including the outliers, will be properly driven. However, heat losses will increase (in some practical cases, to prohibitive levels) as the voltage drop across the driver electronics will, on average, increase.

Another solution includes no consideration for outlier uLEDs. Such skipping of outliers allows the supply voltage to remain low, thereby benefiting from the narrow forward voltage ($V_f$) dispersion among the uLEDs. In this solution, heat losses will be reduced compared to the solution that increases the voltage supply voltage to account for one or more of the $V_f$ of outliers. However, using such a solution, it is likely that some outlier uLEDs will be undriven and/or underdriven. Such undriven and/or under driven uLEDs can appear as dark spots on the uLED array. A bigger population of outliers can be prohibitive in some applications, especially if the undriven or under driven uLEDs remain visible.

Embodiments can include a (e.g., simple) driving scheme to provide voltage compliance to outlier uLED drivers so that the corresponding uLEDs can light up with minor impact on heat losses. Advantages provided by embodiments can address one or more of the following challenges of pixelated matrix LEDs driven with linear driver schemes: (1) providing a cost-effective driving scheme of matrix uLEDs; (2) overcoming driver efficiency limitations; (3) overcoming voltage compliance limitations; or (4) addressing forward voltage dispersion across population of pixels where outliers compromise either voltage compliance or driver efficiency.

FIG. 1 illustrates, by way of example, a diagram of an embodiment of a uLED control system 100. The system 100 as illustrated includes a voltage supply 102 that provides power distributed by a plurality of LED drivers to a matrix of uLEDs 104. The voltage supply 102 provides a constant direct current (DC) voltage $V_{LED}$ 106 and a constant reference voltage $V_{GND}$ 108. The voltage supply 102 can fix the voltage supply to the DC level of $V_{LED}$ 106. This voltage does not dynamically change with a load line response (a load of the array of uLED 104). Thus, $V_{LED}$ 106 does not change dynamically change during a pulse width modulation (PWM)-on period of the current driver signals.

As previously discussed, if $V_{LED}$ 106 is set to account for the outlier pixels of the array of uLEDs 104, the heat losses in the drivers of the uLEDs will be high (even prohibitively high). Conversely, if the $V_{LED}$ 106 is set without consideration of the $V_f$ of the outlier uLEDs, the outlier uLEDs can remain undriven or under driven. Such undriven or under driven LEDs can appear as dark spots in the matrix of uLEDs 104.

Figure 2:
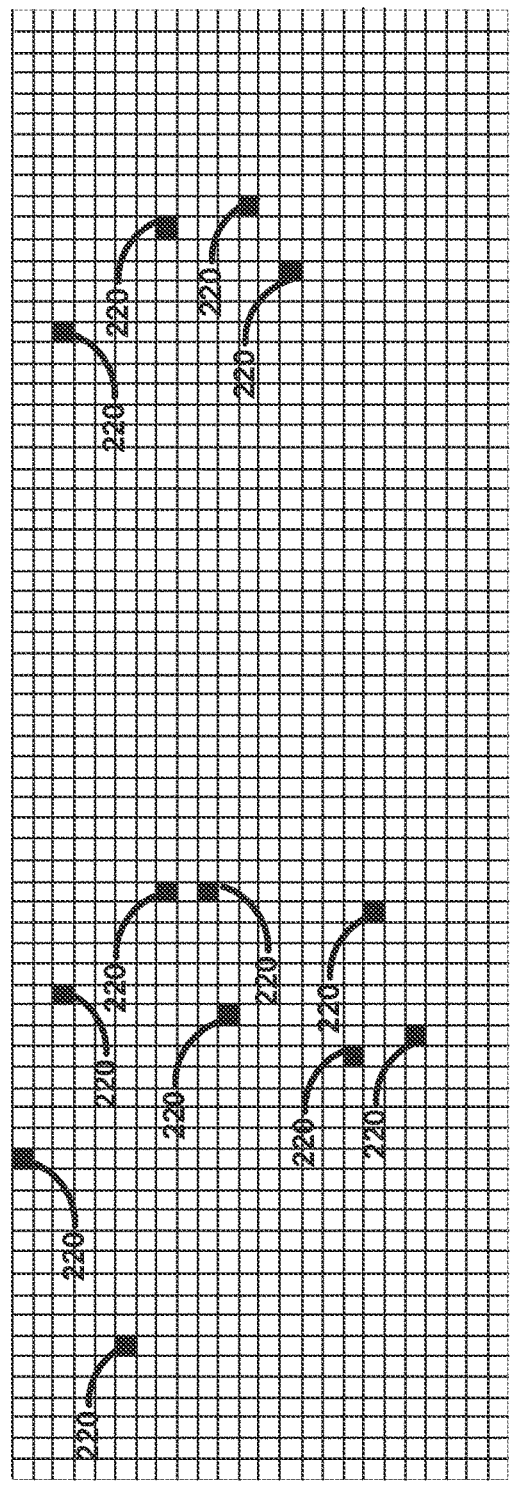
FIG. 2 illustrates, by way of example, a perspective view of an embodiment of a uLED die that includes undriven and/or underdriven uLEDs.

FIG. 2 illustrates, by way of example, a diagram of an embodiment of an array of uLEDs 200 driven without consideration of $V_f$ of the outlier uLEDs. As can be seen, some uLEDs remain undriven or under driven, resulting in black or darker spots 220 in the array of uLEDs 200.

Figure 3:
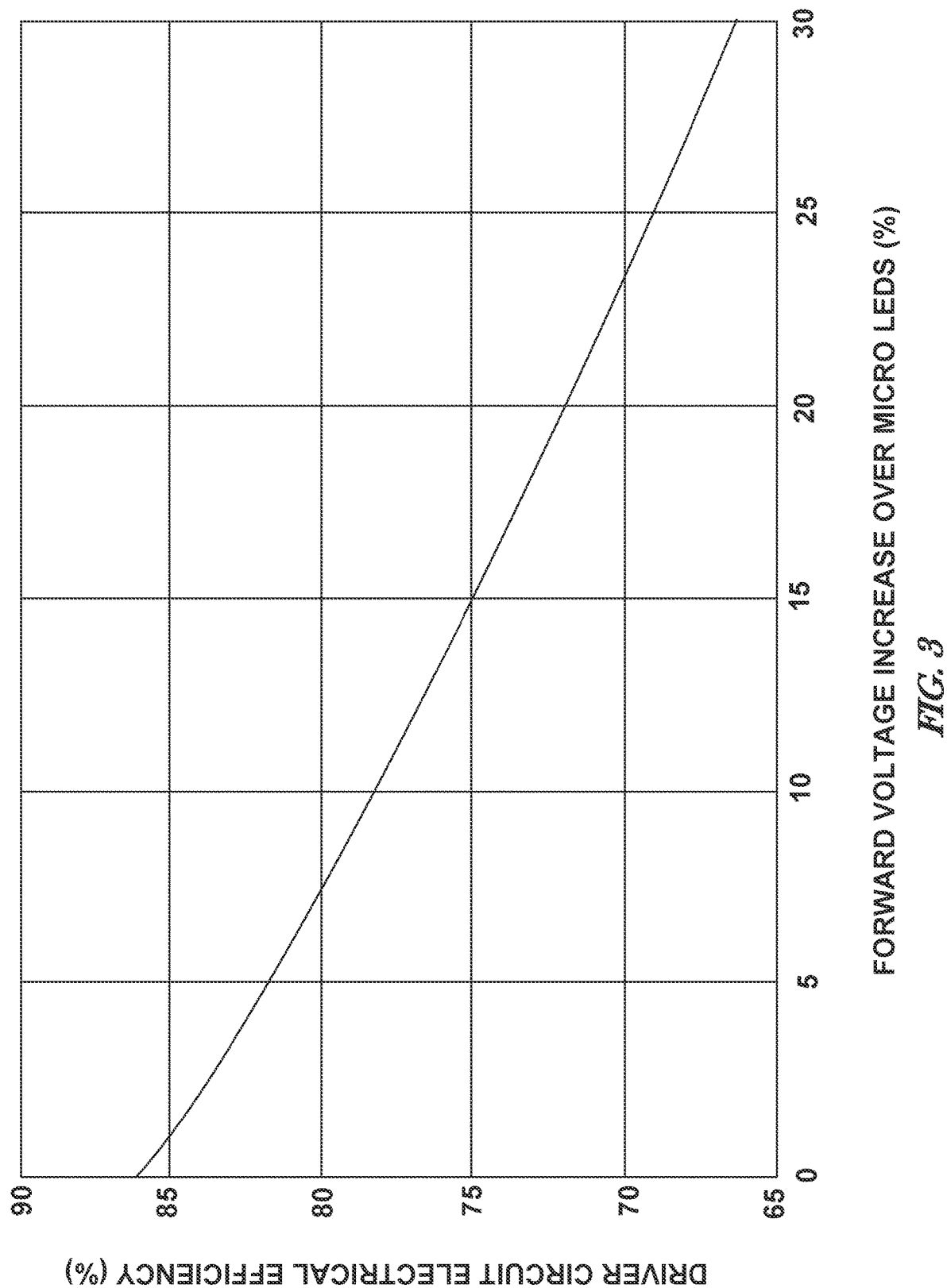
FIG. 3 illustrates, by way of example, a graph of driver circuit electrical efficiency versus uLED forward voltage ($V_f$).

FIG. 3 illustrates, by way of example, a diagram of an embodiment of a graph of efficiency versus number of outlier uLEDs (as a % of all uLEDs in the array of uLEDs 200). As can be seen, as the percentage of pixels that are considered outliers increases, the driver circuit electrical efficiency decreases. A goal can be to keep the electrical efficiency greater than, for example, 85%, 80%, a greater of lesser percentage or some percentage therebetween. Electrical efficiency is defined as power output divided by the power provided. For example, if the outlier $V_f$ increases by 20% over the population of LEDs in the matrix of uLEDs 104, the driver efficiency drops from 86% (reference efficiency considering no outliers) down to 72%.

FIG. 4 illustrates, by way of example, a logical block diagram of an embodiment of a system 400 including an electrical backplane electrically coupled to the matrix of uLEDs 104. The electrical backplane includes uLED drivers 444 and power provisioning circuitry. Further details of a linear driver version of the uLED drivers 444 are provided regarding FIG. 5. The power provisioning circuitry includes $V_{LED}$ 106 and the reference voltage $V_{GND}$ 108 from the power supply. The $V_{LED}$ 106 is provided to a power plane 442. The $V_{GND}$ 108 is provided to a ground plane 440. The uLED drivers 444 are powered using the $V_{LED}$ 106 from the power plane 442. The uLED drivers 444 control, via an electrical interconnect 446 individual or groups of uLEDs in the matrix of uLEDS 104. The uLED drivers 444 can control whether the uLED is on, off, a duty cycle, or other power control of the uLEDs 104.

The matrix of uLEDs 104 are electrically coupled to the uLED drivers 444 through the electrical interconnects 446. The matrix of uLEDs 104 are electrically coupled to the ground plane 440 through other electrical interconnects 448. A dielectric 450 electrically and physically separates the uLED drivers 444 from the ground plane 440. That is, the dielectric 450 is situated (e.g., directly) between the uLED drivers 444 and the ground plane 440 and (e.g., directly) between the ground plane 440 and the power plane 442.

FIG. 5 illustrates, by way of example, a logical circuit diagram of an embodiment of a system 500 that includes the uLED driver 444 and a uLED 550 of the matrix of uLEDs 104. The uLED driver 444 controls an electrical signal 554 on the electrical interconnect 446. The uLED driver 444, by controlling the electrical signal 554, can inhibit or allow current to flow to the uLED 550. Using this control, the uLED driver 444 can control whether and when the individual or group of uLEDs 550 is on and the duty cycle of the uLEDs.

To overcome the limitations of other uLED driving schemes and to increase electrical efficiency of a matrix of uLEDs 104, some improved driving schemes are provided. Embodiments consider uLED dies with individually addressable pixels. The uLED dies include uLED drivers 444 that include linear driver architectures operating in PWM mode. The control scheme(s) can help minimize or reduce the total root mean square (RMS) and harmonic current driven by the voltage supply 102, by at least in part, the phases of pulse width modulation (PWM) control signals of the uLEDs being randomized.

Embodiments can include a voltage supply 102, the output voltage of which can be dynamically modulated and controlled by a load (e.g., a controller 1660 of the load (see FIG. 16)) with a sufficient bandwidth response Embodiments can include a control scheme wherein outlier pixels can be identified (e.g., by means of a sensing voltage, and classified as such (see FIG. 16)), before or during runtime of the matrix of uLEDs 104. The controller 1660 can cause the voltage from the voltage supply 102 to increase to a specified voltage value during every cycle or every several cycles of the PWM signal of the drivers. The higher voltage can be specified as a function of a distribution of the forward voltages ($V_f$) of the outlier pixels.

Embodiments can include a control scheme that repeatedly (e.g., periodically, such as at predefined intervals) increases the voltage supply to a specified voltage value during every cycle or every several cycles of the PWM signal of the drivers. Said higher set voltage can be specified as a function of the forward voltage ($V_f$) of the outlier pixels. A forward voltage ($V_f$) of an LED is the voltage drop across the LED while the LED is illuminating.

Embodiments can include a control scheme wherein the random PWM phase control of the identified outlier pixels can be synchronized with an increase of the power supply voltage. Embodiments can include a control scheme to synchronize the rise of the voltage provided by the power supply with the PWM signals of the outlier pixels such that their compliance voltage can be satisfied at least during a period established by the increase in supply voltage. Embodiments can provide a control scheme that includes a modifiable set current of outlier pixels.

Temperature gradients are an important consideration in large area matrix arrays. A typical duty cycle map renders a power density distribution and a temperature distribution such that the forward voltage variation changes significantly between the regions of high power density and the regions of low power density, resulting in a $V_f$ spread >150 mV. Adding the $V_f$ dispersion of the manufacturing process, the $V_f$ spread may be higher than 400 mV. Plotting the required voltage compliance as a function of duty cycle of such pixel configuration reveals that $V_f$ decreases with the increase of duty cycle.

Figure 6:
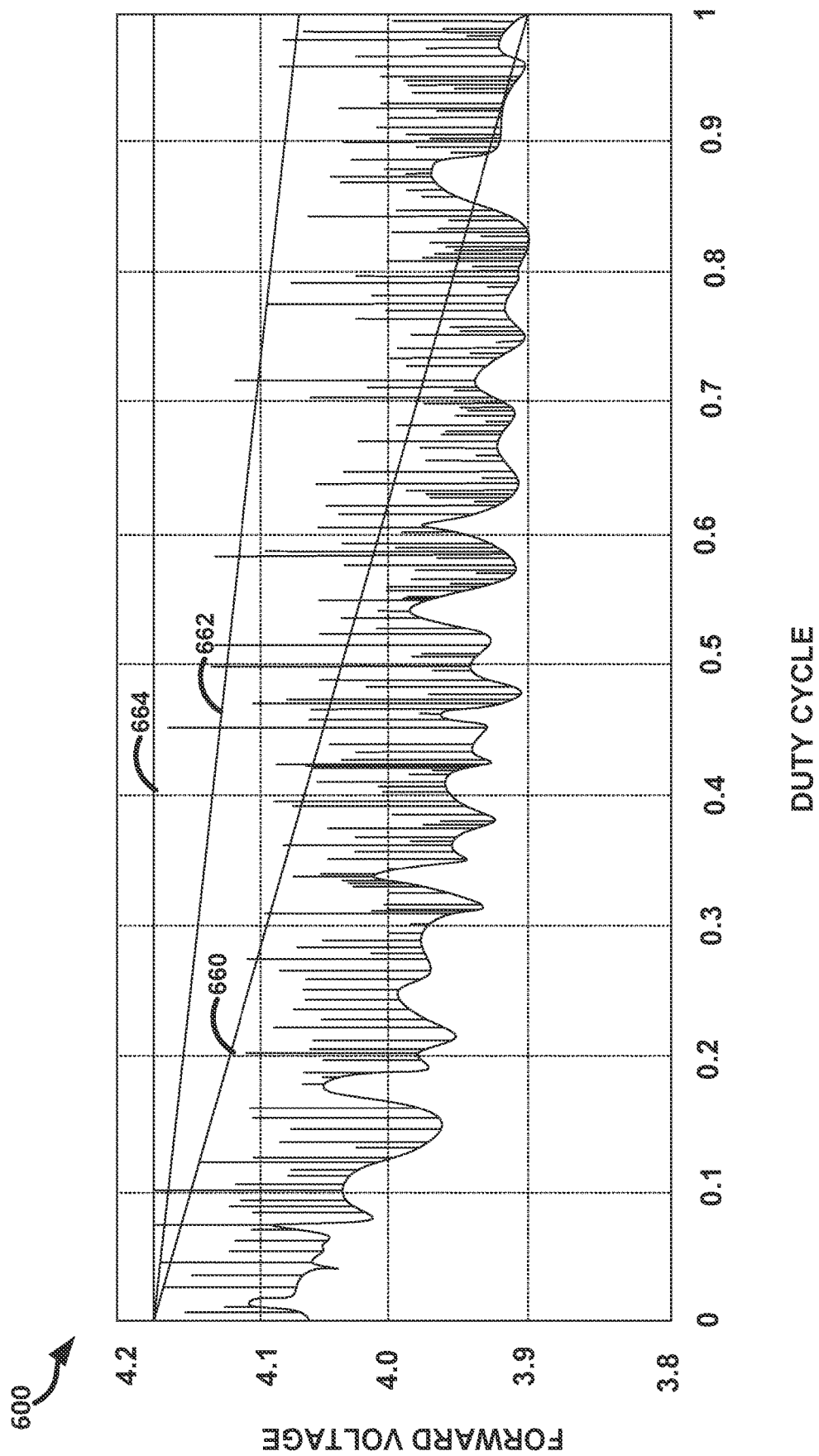
FIG. 6 illustrates, by way of example, a graph of forward voltage (Vf) of uLEDs vs duty cycle for a typical matrix of uLEDs.

FIG. 6 illustrates, by way of example, a graph 600 of forward voltage ($V_f$) of uLEDs versus duty cycle for a typical matrix of uLEDs 104 (see, e.g., FIG. 1). As can be seen, the forward voltage ($V_f$) generally decreases with duty cycle. A reason for this trend is that the forward voltage ($V_f$) drops with an increase in temperature and the higher the duty cycle the hotter the uLED (in general). The relationships between $V_f$, temperature, and duty cycle can be exploited to apply a supply voltage to more optimally drive uLEDs with different duty cycles. These relationships include, for example: uLEDs operating with high duty cycle have a higher temperature hotter and so their $V_f$ tends to be lower and uLEDs operating with low duty cycle run cooler so their $V_f$ tends to be higher.

Some example load-lines 660, 662, 664 are depicted in FIG. 6. Note that the steeper the slope of the load line gets (the slope of the load-line 660 is greater than the slope of the load line 662, etc.), the higher the number of uLEDs that will not fulfil a voltage compliance condition (e.g., $V_{LED} > V_f$, note that load-lines 660, 662, 664 represent $V_{LED}$), and hence these pixels may be driven below their set current levels. Embodiments discussed herein strike a balance between the number of outlier uLEDs that are not driven by $V_{LED}$ and the temperature concerns of having $V_{LED}$ too high for too long.

Figure 7:
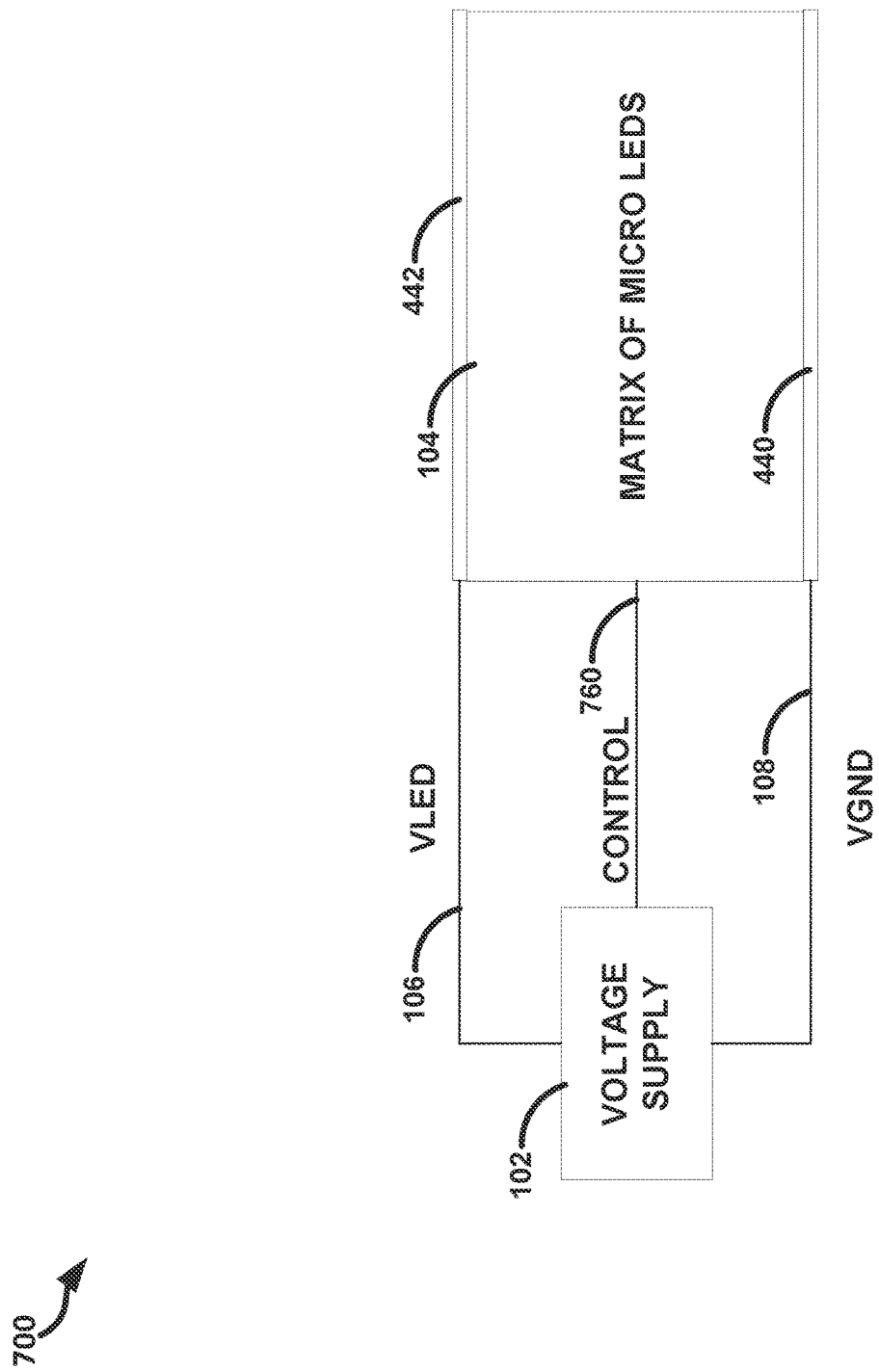
FIG. 7 illustrates, by way of example, a logical circuit diagram of an embodiment of a system that considers outlier pixel Vf to drive the matrix of uLEDs.

FIG. 7 illustrates, by way of example, a logical circuit diagram of an embodiment of a system 700 that considers outlier pixel $V_f$ to drive the matrix of uLEDs 104. The system 700 is similar to the system 100 of FIG. 1, with the system 700 including circuitry to provide a control command 760 to the voltage supply 102. The control command 760 indicates that the voltage supply 102 is to supply a higher voltage in a next voltage supply period. The control command 760 can be issued by a controller 1660 (see FIG. 9) coupled to the uLED drivers 444. The voltage ($V_{LED}$) supplied by the voltage supply 102 includes sufficiently dynamic control bandwidth for establishing a modulated signal of the same or similar frequency as that of a PWM current produced by the driver 444.

Figure 8:
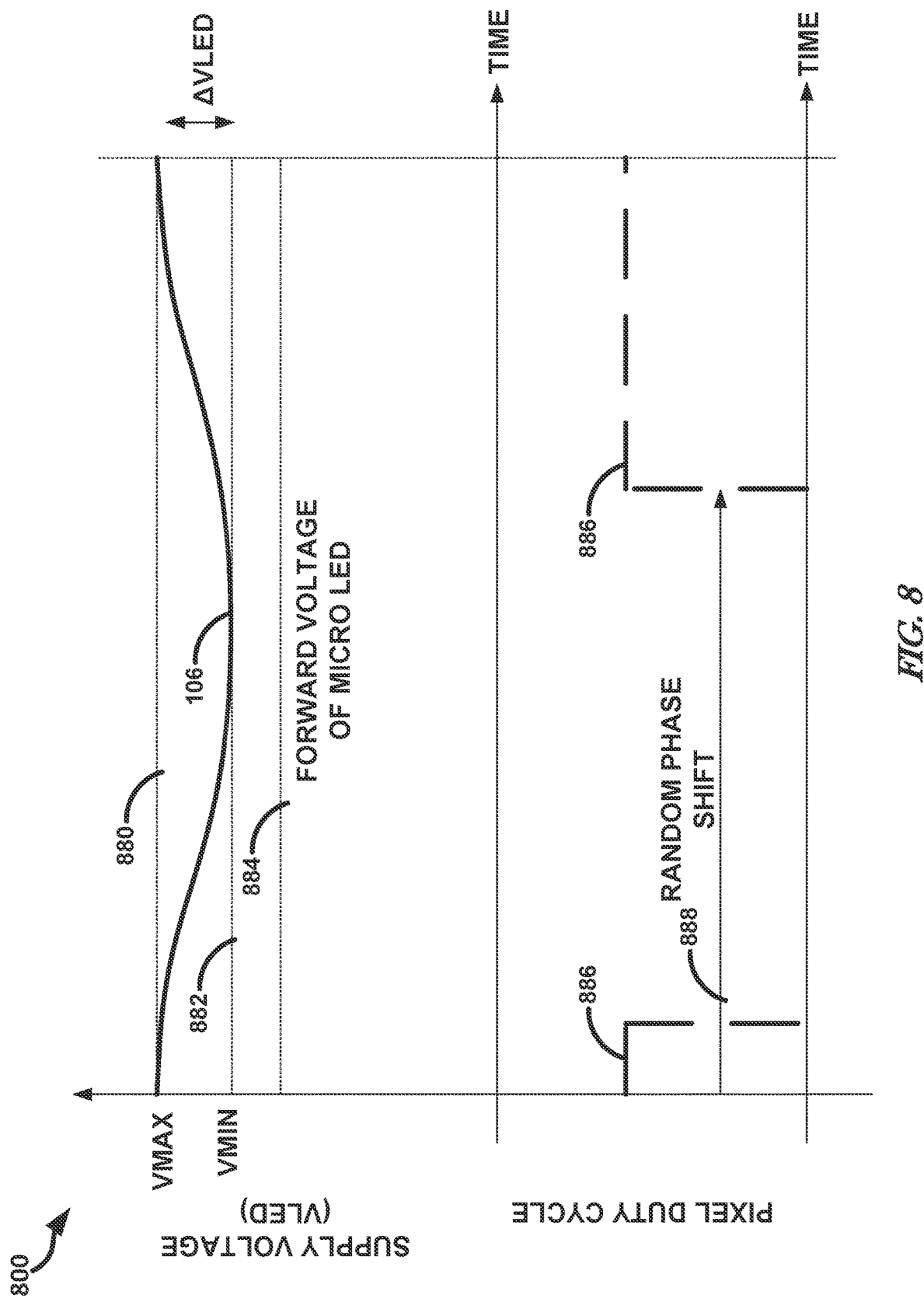
FIG. 8 illustrates, by way of example, a graph of a modulated voltage supply ($V_{LED}$) and a corresponding uLED response.

FIG. 8 illustrates, by way of example, a graph 800 of a modulated voltage supply (e.g., $V_{LED}$ 106 of FIG. 1) and a corresponding uLED response. The uLED response is represented by a duty cycle on period 886. The modulated supply voltage ($V_{LED}$ 106) in FIG. 8 oscillates between voltage levels ($V_{MIN}$ 884 and $V_{MAX}$ 880) above the compliance voltage (forward voltage ($V_f$) 884) of a uLED. Thus, such uLED receives a pulse width modulation (PWM) power signal with random phase shifted on period 886 that can be triggered anywhere within the cycle period by the driver 444. Arrow 888 indicates the random phase shift.

Examples of $V_{MIN}$ 884 and $V_{MAX}$ 880 are dependent on materials of the uLEDs. For InGaN blue, $V_{MIN}$ 884 can be about 2.5V and $V_{MAX}$ 880 can be about 5V. For AlInGaP $V_{MIN}$ 884 can be about 1.5V and $V_{MAX}$ 880 can be about 4V. Other materials can have different $V_{MIN}$ 884 and $V_{MAX}$ 880.

A different situation occurs when the forward voltage of a uLED is above $V_{MIN}$ 884. Such uLEDs are considered outliers. For such uLEDs, a controller 1660 (described below with reference to FIG. 16) can monitor an on-state of the uLED and help ensure that the on time of the uLED does not fall within a time interval in which $V_f > V_L ED$. The controller 1660 can alter timing of signals to driver 444, such as to help ensure that the uLED has sufficient voltage for operation and gets as much on time as is allowed until $V_{LED} < V_f$ again. FIGS. 9-15 discuss a few scenarios handled by embodiments in which $V_f > V_{LED}$ for at least a portion of a modulation period of $V_{LED}$ 106. A modulation period is a time between consecutive times at which $V_{LED} = V_{MAX}$ or at which $V_{LED} = V_{MIN}$.

When there is a choice to shift the phase to either before or after a portion of the period where $V_{LED} > V_f$ (labelled as the disabled phase in FIGS. 9-13), the phases can be shifted to before, after, or a combination thereof of the disabled phase. In splitting the on-phase of the uLED to before and after the disabled period can allow the corrected phases to be more uniformly distributed over one PWM period. This uniform distribution provides for lower root mean square (RMS) and harmonic currents. Such a change that splits the period to before and after the disabled phase are provided in some of the FIGS.

Figure 9:
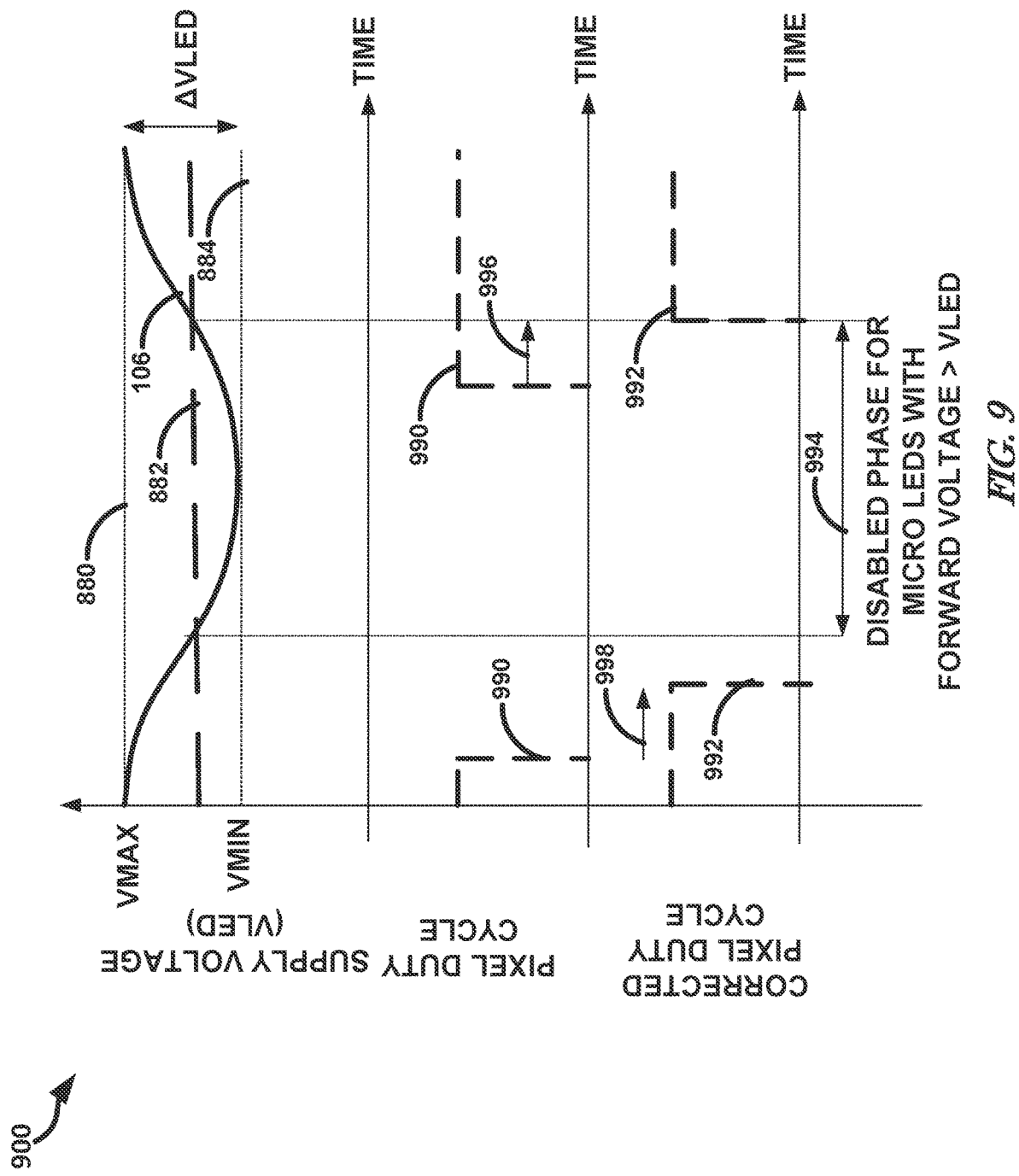
FIG. 9 illustrates, by way of example, a graph of electrical parameters versus time of an embodiment.

FIG. 9 illustrates, by way of example, a graph 900 of electrical parameters versus time of an embodiment. The electrical parameters includes $V_{LED}$ 106, PWM-on time 990 of a uLED before correction, and PWM-on time 992 of the uLED after correction. A disabled phase 994 for uLEDS includes a time period for which the forward voltage of the uLED is greater than a supply voltage $V_{LED}$ ($V_f > V_{LED}$).

The controller 1660 can have access to data indicating the $V_f$ 882 of the uLED, $V_{MAX}$ 880, $V_{MIN}$ 884, and frequency of $V_{LED}$ 106 provided by the voltage supply 102, and duty cycle of the uLED. The controller 1660 can use this data to determine when to send a command to the driver 444 to drive the uLED. The command can cause the driver 444 to turn the uLED on. The command can be issued so that the PWM-on time 990 of the uLED does not overlap with a time period for which the forward voltage 882 of the uLED is greater than the supply voltage $V_{LED}$ ($V_f > V_{LED}$) (the disabled phase 994). The PWM-on time 992 shows such an adjusted PWM-on time that does not overlap with the disabled phase 994. The adjustment of the PWM on-time is indicated by arrows 996 and 998.

Figure 10:
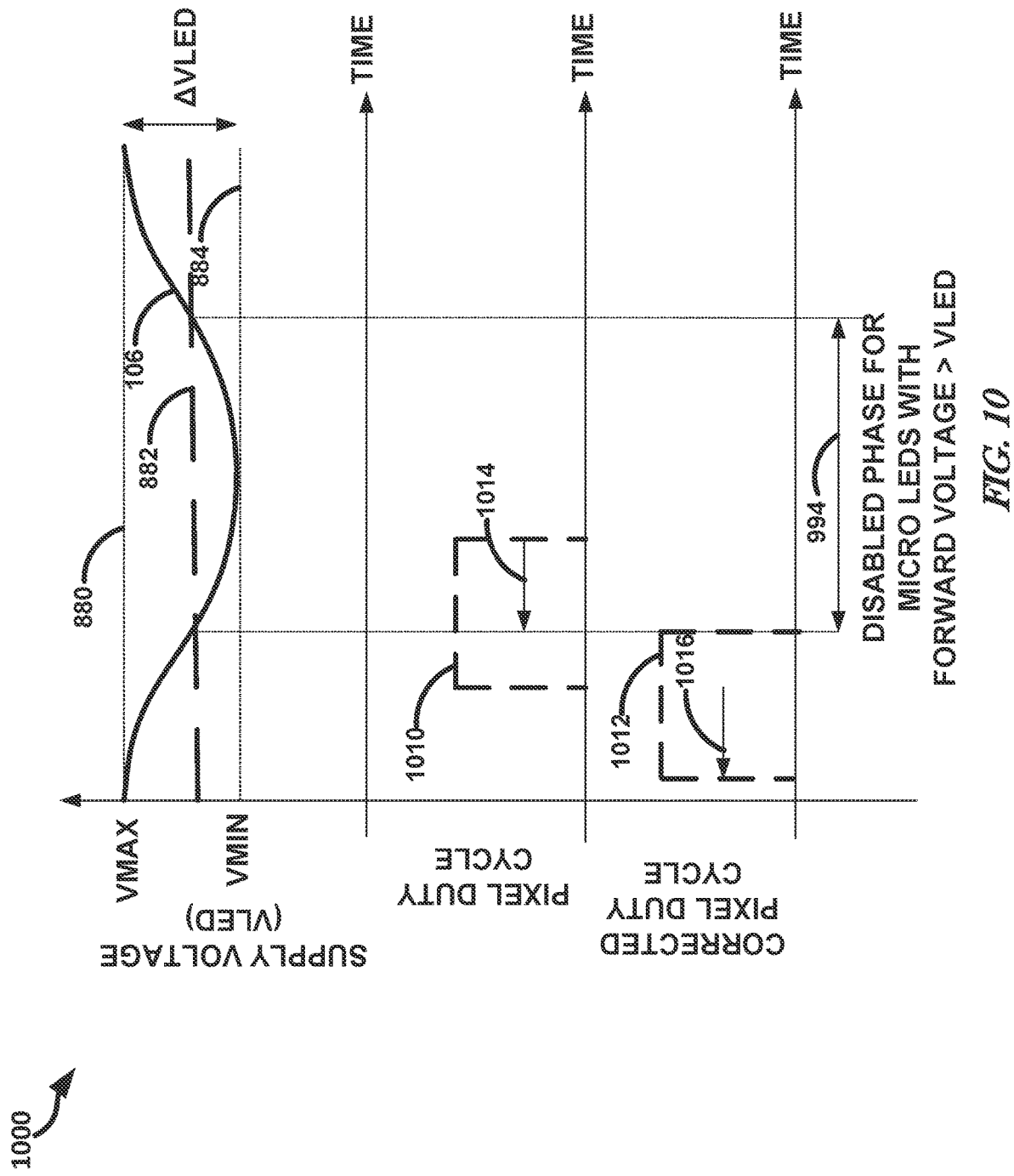
FIG. 10 illustrates, by way of example, a graph of electrical parameters versus time of an embodiment of an outlier uLED (outlier defined as $V_f > V_{LED}$ for at least a portion of time).
Figure 11:
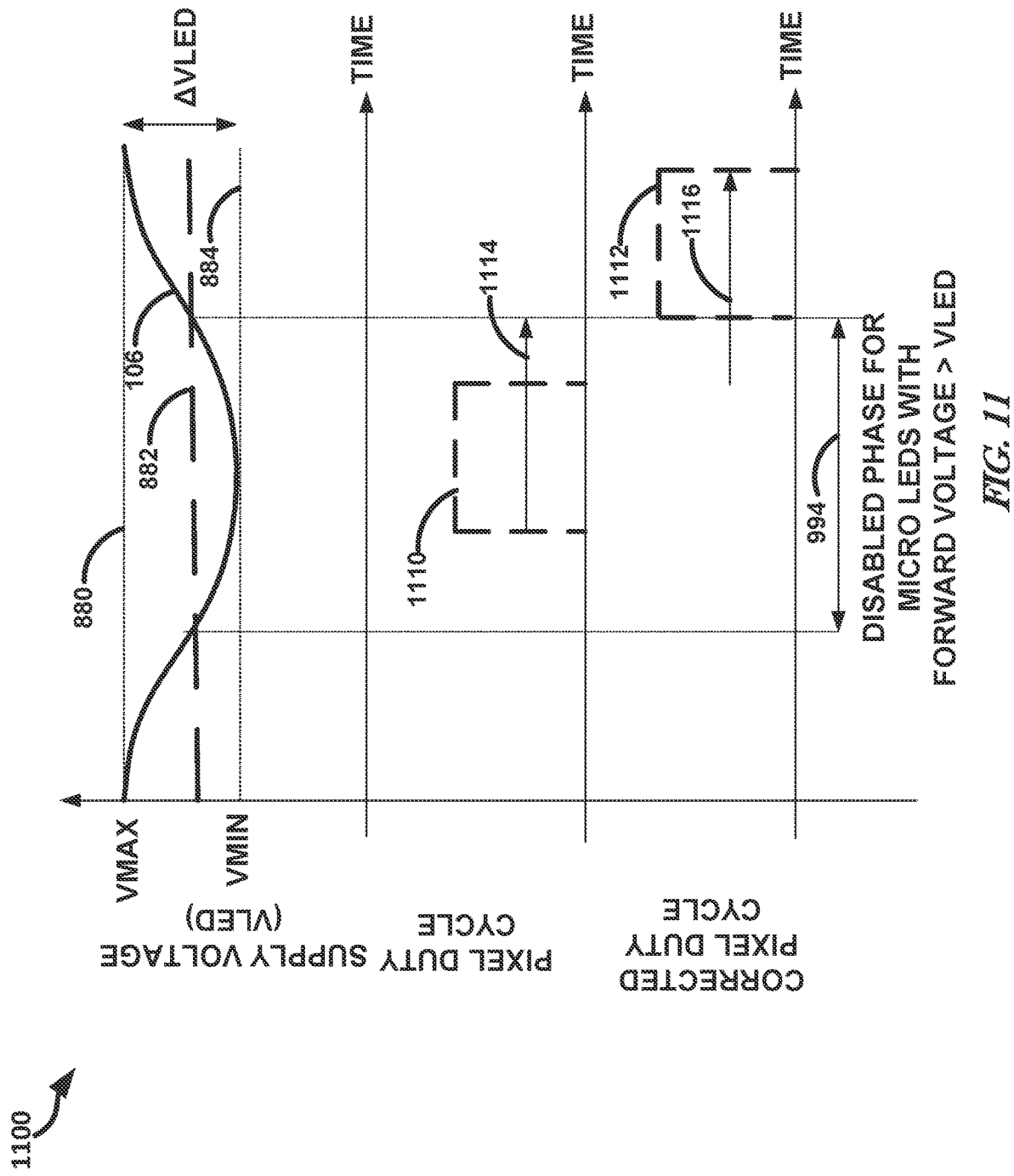
FIG. 11 illustrates, by way of example, a graph of electrical parameters versus time of an embodiment of an outlier uLED.

FIG. 10 illustrates, by way of example, a graph 1000 of electrical parameters versus time of an embodiment of an outlier uLED (outlier defined as $V_f > V_{LED}$ for at least a portion of time). The uLED of FIG. 10 includes a duty cycle 1010 that corresponds to a duration that is less than an amount of time that $V_f > V_{LED}$ in an incline or decline of the $V_{LED}$ 106 over a single cycle (time between $V_{LED} = V_{MAX}$ or $V_{LED} = V_{MIN}$). In such an instance, the controller 1660 can issue a command that causes the uLED driver 444 to drive the uLED so that the PWM-on period 1012 after correction ends at about the time $V_f=V_{LED}$ or begins at about the time $V_f=V_{LED}$. In the example of FIG. 11, described in more detail below, the controller 1660 has adjusted the PWM-on period 1110 to end at about the time $V_f=V_{LED}$. An amount of correction is indicated by arrows 1014, 1016 of equal magnitude. The controller 1660 can determine a time at which $V_f>V_{LED}$ (the disabled phase 994) and adjust the on time to still satisfy the duty cycle of the uLED.

FIG. 11 illustrates, by way of example, a graph 1100 of electrical parameters versus time of an embodiment of an outlier uLED. The uLED of FIG. 11 includes a PWM-on period 1110 (corresponding to a duty cycle) that corresponds to a duration that is less than an amount of time that $V_f>V_{LED}$ in an incline (time period over which a slop of $V_{LED}$ vs time is positive) or decline (time period over which the slope of $V_{LED}$ vs time is negative) of the $V_{LED}$ 106 over a single cycle (time between $V_{LED}=V_{MAX}$ or $V_{LED}=V_{MIN}$). In such an instance, the controller 1660 can issue a command that causes the uLED driver 444 to drive the uLED so that the PWM-on period 1112 after correction ends at about the time $V_f=V_LED$ or begins at about the time $V_f=V_{LED}$. In the example of FIG. 11, the controller 1660 has adjusted the PWM-on period 1110 to begin at about the time $V_f=V_{LED}$. An amount of correction is indicated by arrows 1114, 1116 of equal magnitude. The controller 1660 can determine a time at which $V_f>V_{LED}$ (the disabled phase 994) and adjust the on time to still satisfy the duty cycle of the uLED.

Figure 12:
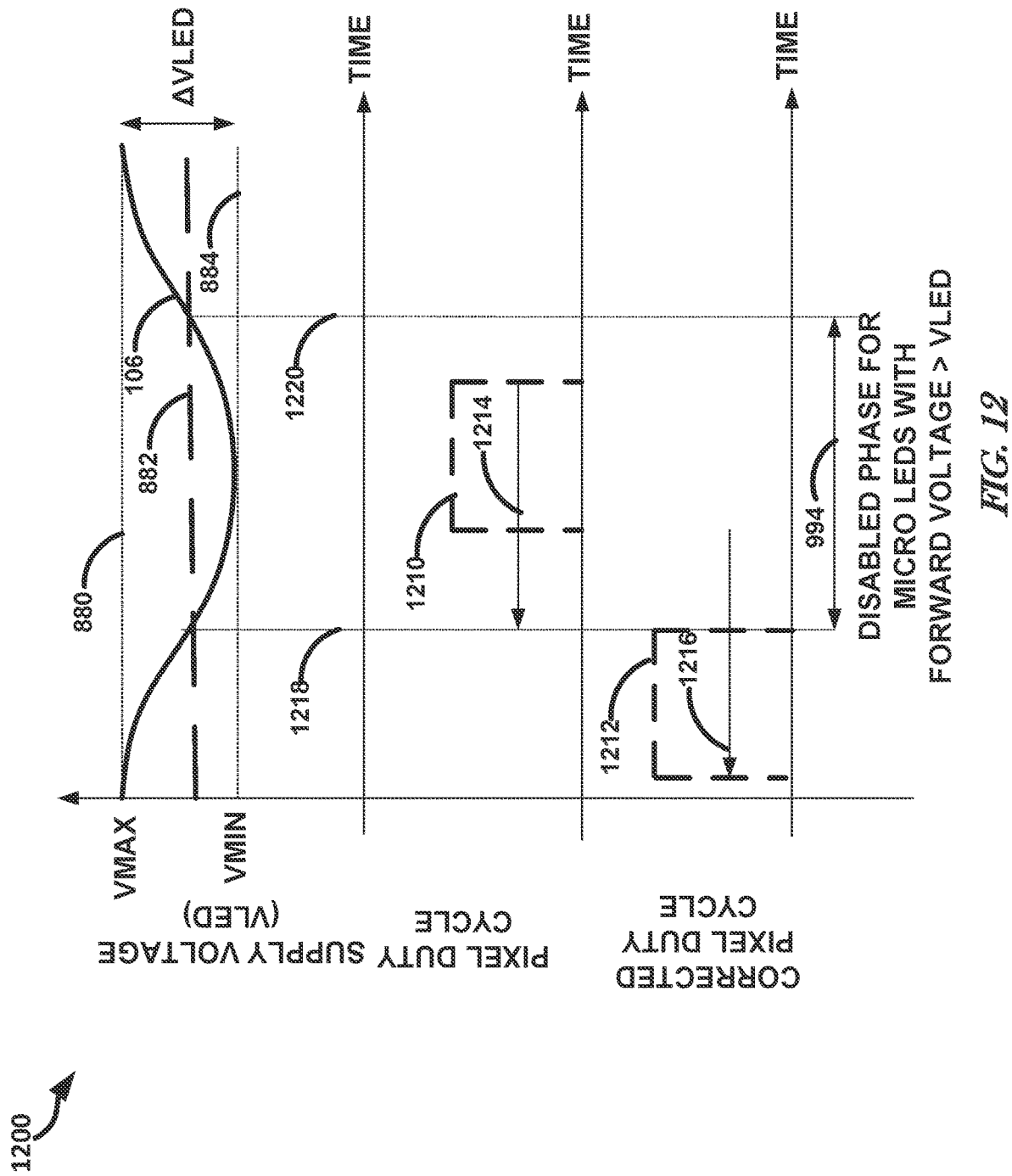
FIG. 12 illustrates, by way of example, a graph of electrical parameters versus time of an embodiment of an outlier uLED.

FIG. 12 illustrates, by way of example, a graph 1200 of electrical parameters versus time of an embodiment of an outlier uLED. In the example of FIG. 12, the uLED can be scheduled to power on and off (an entirety of the PWM-on period of the uLED) falls within the disabled phase 994. In such an instance, the controller 1660 can choose to move the PWM-on period to before or after the $V_{LED}<V_f$. In the example of FIG. 12, the controller 1660 moved the PWM-on period 1210 of the uLED to before a time $V_{LED}<V_f$ and such that the entirety of the PWM-on period 1210 occurs while $V_{LED}>V_f$. To do this, the controller 1660 can, for example, determine a difference between an expected falling edge of the PWM-on period 1210 and a time before the PWM-on period 1210 that $V_{LED}$ 106=$V_f$882 (indicated by dashed line 1218). In another example, the controller 1660 can determine a difference between an expected rising edge of the PWM-on period 1210 and a time after the PWM-on period 1210 that $V_{LED}$ 106=$V_f$882 (indicated by dashed line 1220).

The difference between the falling edge of the PWM-on period 1210 and the time before the PWM-on period 1210 at which $V_{LED}$ 106=$V_f$882 is indicated by arrow 1214. This difference can be used to adjust the time at which the rising edge of the PWM-on period 1210 begins (indicated by arrow 1216). A corrected PWM-on period 1212, that accounts for the adjustment indicated by the arrow 1216, moves the PWM-on period 1212 of the uLED to be within a time period at which $V_f<V_{LED}$ (outside the disabled phase 994).

Figure 13:
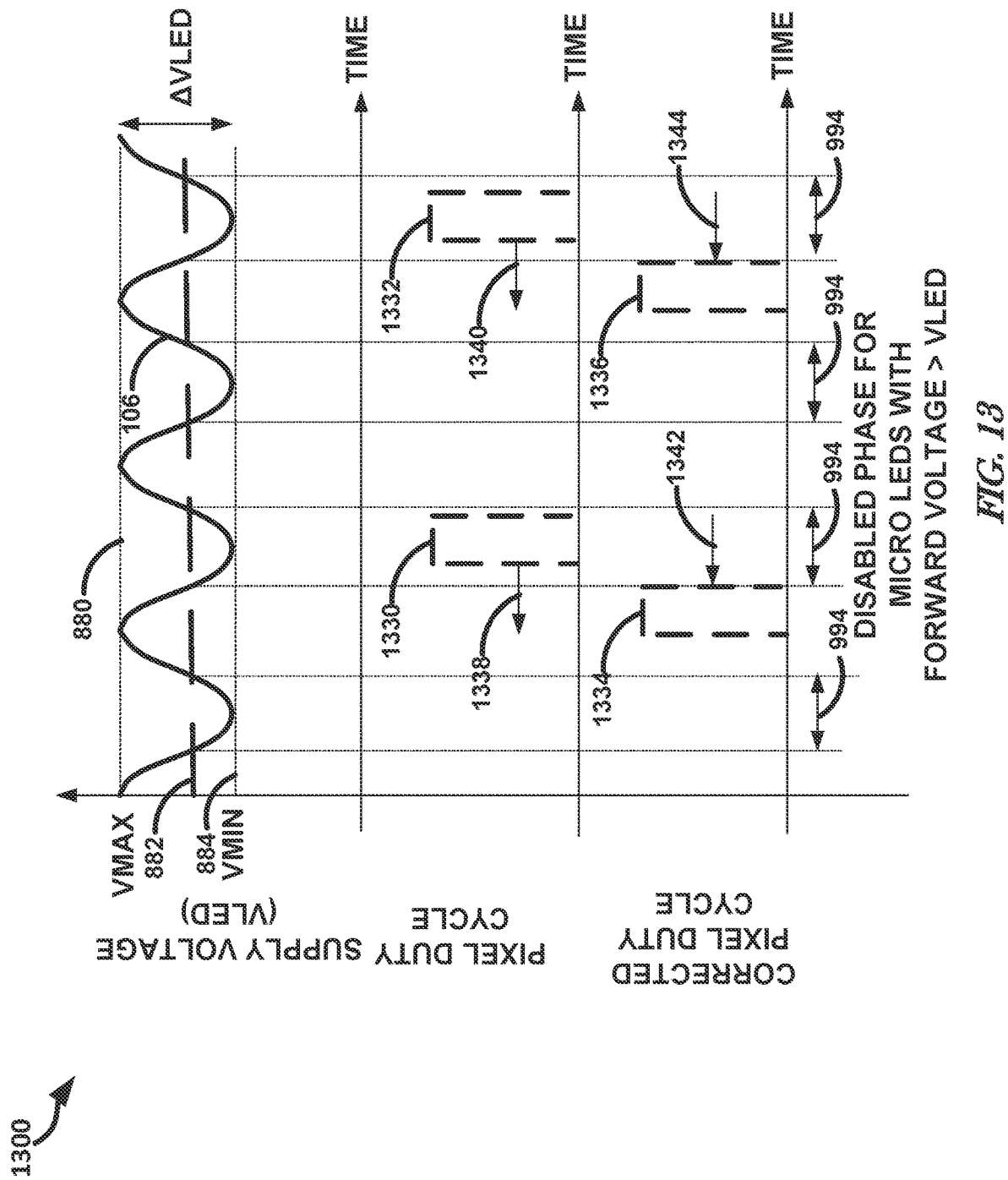
FIG. 13 illustrates, by way of example, a graph of electrical parameters versus time of an embodiment of an outlier uLED before and after alteration of the uLED on time to ensure that the uLED $V_f < V_{LED}$ during a PWM-on period of the uLED.

FIG. 13 illustrates, by way of example, a graph 1300 of electrical parameters versus time of an embodiment of an outlier uLED before and after alteration of the uLED on time to ensure that the uLED $V_f<V_{LED}$ during a PWM-on period of the uLED. In the example of FIG. 13, a frequency of $V_{LED}$ 106 is such that $V_{LED}$ cycles multiple times (equals either VMAX 880 or VMIN 884 multiple times) between PWM-on periods 1330, 1332 of the uLED. In such examples, time correction is only performed when the PWM-on period 1330, 1332 overlaps with the disabled phase 994.

In FIG. 13, the time between occurrences of $V_{LED}$ 106=$V_{MAX}$ is less than the time between PWM-on periods 1330, 1332. If the time between consecutive PWM-on periods 1330, 1332 (e.g., between rising edges of consecutive PWM-on periods 1330, 1332) is not an integer multiple of the time between occurrences of $V_{LED}$ 106=$V_{MAX}$ 880, the adjustment of the PWM-on period 1330 (indicated by arrows 1338, 1340) can change in each cycle. If the time between consecutive PWM-on periods 1330, 1332 is an integer multiple of the time between occurrences of $V_{LED}$ 106=$V_{MAX}$ 880, the adjustment (indicated by arrows 1338, 1340) of the PWM-on period 1330 rising edge time can remain the same. The adjustments made to the PWM-on periods 1330, 1332 are illustrated as PWM-on periods 1334, 1336, respectively, and the adjustments made are indicated by arrows 1342, 1344 of same magnitude as 1338, 1340, respectively.

Figure 14:
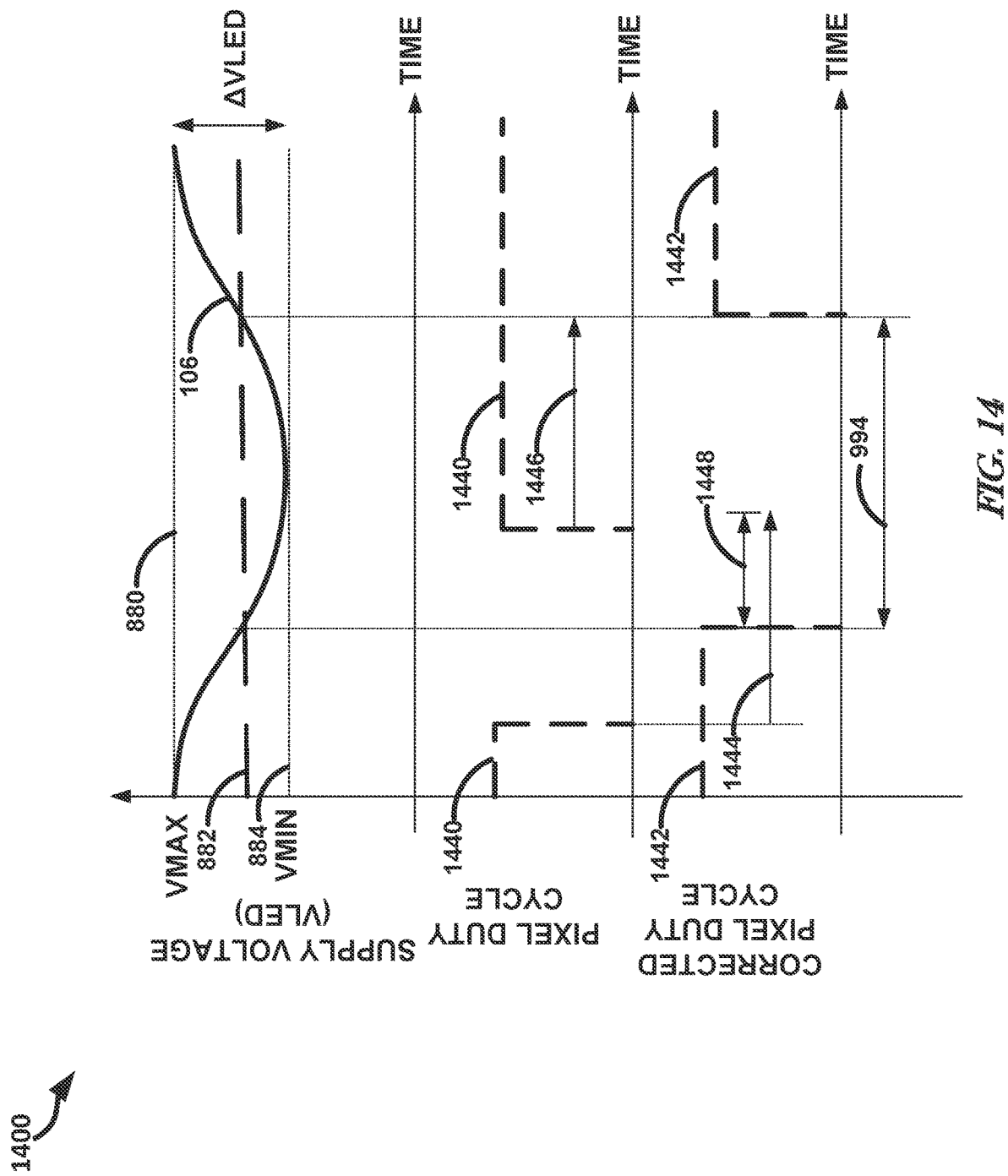
FIG. 14 illustrates, by way of example, a graph of electrical parameters versus time of an embodiment of an outlier uLED before and after alteration of the uLED on time.

FIG. 14 illustrates, by way of example, a graph 1400 of electrical parameters versus time of an embodiment of an outlier uLED before and after alteration of the uLED on time. In the example of FIG. 14, the PWM-on time 1440 of the uLED is greater than an amount of time that $V_{LED}$ 106 is greater than $V_f$ 882 of the uLED. Even after PWM-on time adjustment, indicated by arrows 1444 and 1446, the amount of time $V_{LED}>V_f$ is less than the PWM-on time. In such situations it might be possible to adjust a parameter (e.g., drive current, PWM on-time, or other parameter) of the uLED or one or more neighboring uLEDs to compensate for the reduced duty cycle of the uLED. One potential solution to this issue is to do nothing, such as if the amount of PWM-on time that is lost (indicated by arrow 1448) does not visibly alter the appearance of the image. This can be acceptable depending on a reduction in uLED intensity provided by the reduction in PWM-on time as well as the number of outlier uLEDs.

Another solution to the issue of losing PWM-on time includes increasing the $V_{MIN}$ 884. This solution increases the heat produced and reduces the electrical efficiency of the matrix of uLEDs 104 to increase the amount of time that $V_{LED}$ 106 is greater than $V_f$ 882. The time when $V_f$ 882 $>V_{LED}$ 106 will be reduced, allowing to increase the on-time of the pixel.

Yet another solution to the issue of losing PWM-on time includes reducing the duty cycle and increasing a peak current of the uLED driver 444 locally (only for the uLEDs with $V_f$ 882 $>V_{LED}$ 106 and with duty cycle corresponding to PWM-on time greater than an amount of time that $V_{LED}$ 106$>V_f$882. This solution can keep the same target average current, but the increase of the peak intensity will increase $V_f$ as well as reduce efficiency due to the intrinsic uLED voltage drop.

Figure 15:
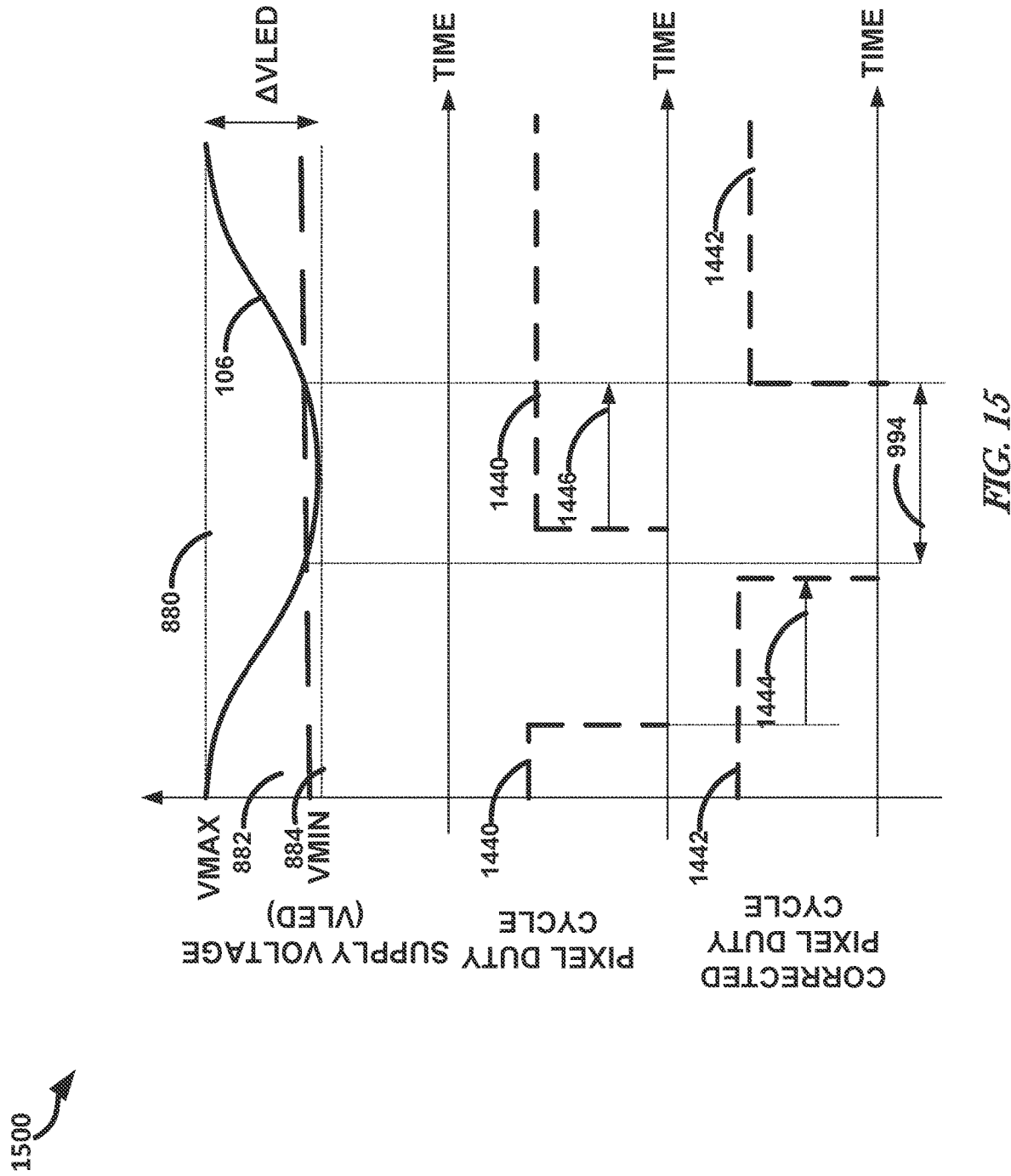
FIG. 15 illustrates, by way of example, a graph of electrical parameters versus time of an embodiment of an outlier uLED before and after alteration of the uLED on time.

FIG. 15 illustrates, by way of example, a graph 1500 of electrical parameters versus time of an embodiment of an outlier uLED before and after alteration of the uLED on time. In FIG. 15, $V_{MAX}$ 880 and $V_{MIN}$ 884 have been increased relative to that of FIG. 14. This allows the disabled phase 994 of the uLED to be reduced such that the PWM-on time 1440 can be accommodated without having overlap between the disabled phase 994 and the PWM-on time 1442 (after compensation).

Figure 16:
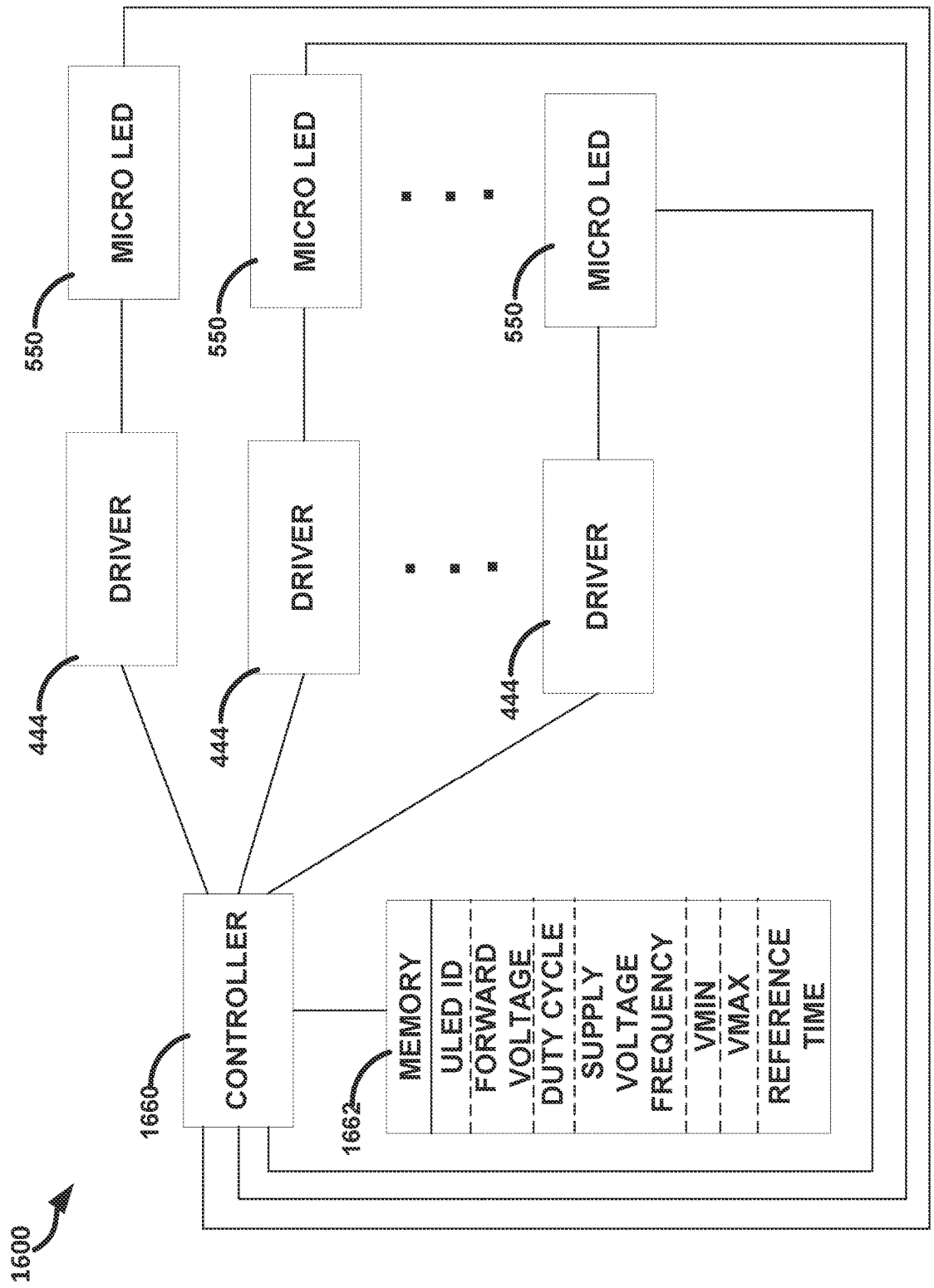
FIG. 16 illustrates, by way of example, a block diagram of an embodiment of a system for adjusting uLED PWM-on period.

FIG. 16 illustrates, by way of example, a block diagram of an embodiment of a system 1600 for adjusting uLED 550 PWM-on time. The system 1600 includes the controller 1660 coupled to a memory 1662. The controller 1660 is further coupled to control uLED drivers 444, which drive respective uLEDs 550. The memory 1662, as illustrated, includes (for each uLED 550) a uLED identification (e.g., a row and column of the uLED 550 in the matrix of uLEDs 104 or other unique identification of the uLED 550). The memory 1662 further includes a duty cycle for the uLED 550 corresponding to the uLED ID. The memory 1662 can further include $V_{MIN}$ 884, $V_{MAX}$ 880, and a frequency of $V_{LED}$ 106. The memory 1662 can further include a reference time that can be used by the controller 1660 to determine when $V_{LED}$ 106 will be at $V_f$ 882 of the uLED 550. The controller 1660 can thus determine, based on the data in the memory 1662, when to send commands to the driver 444 to operate the uLED 550 such that $V_{LED} > V_f$ for as much of the uLED 550 duty cycle as possible.

Embodiments that modulate $V_{LED}$ 106 can recover an efficiency of the driver 444 to well-above 80% with just a few hundred mV modulation range in cases of typical dispersions values around 100 mV. A total peak current drawn by the voltage supply 102 can only moderately increase as a function of the modulation amplitude set by the proposed control scheme. Therefore, interconnected related RMS losses are not expected to significantly worsen.

Figure 17:
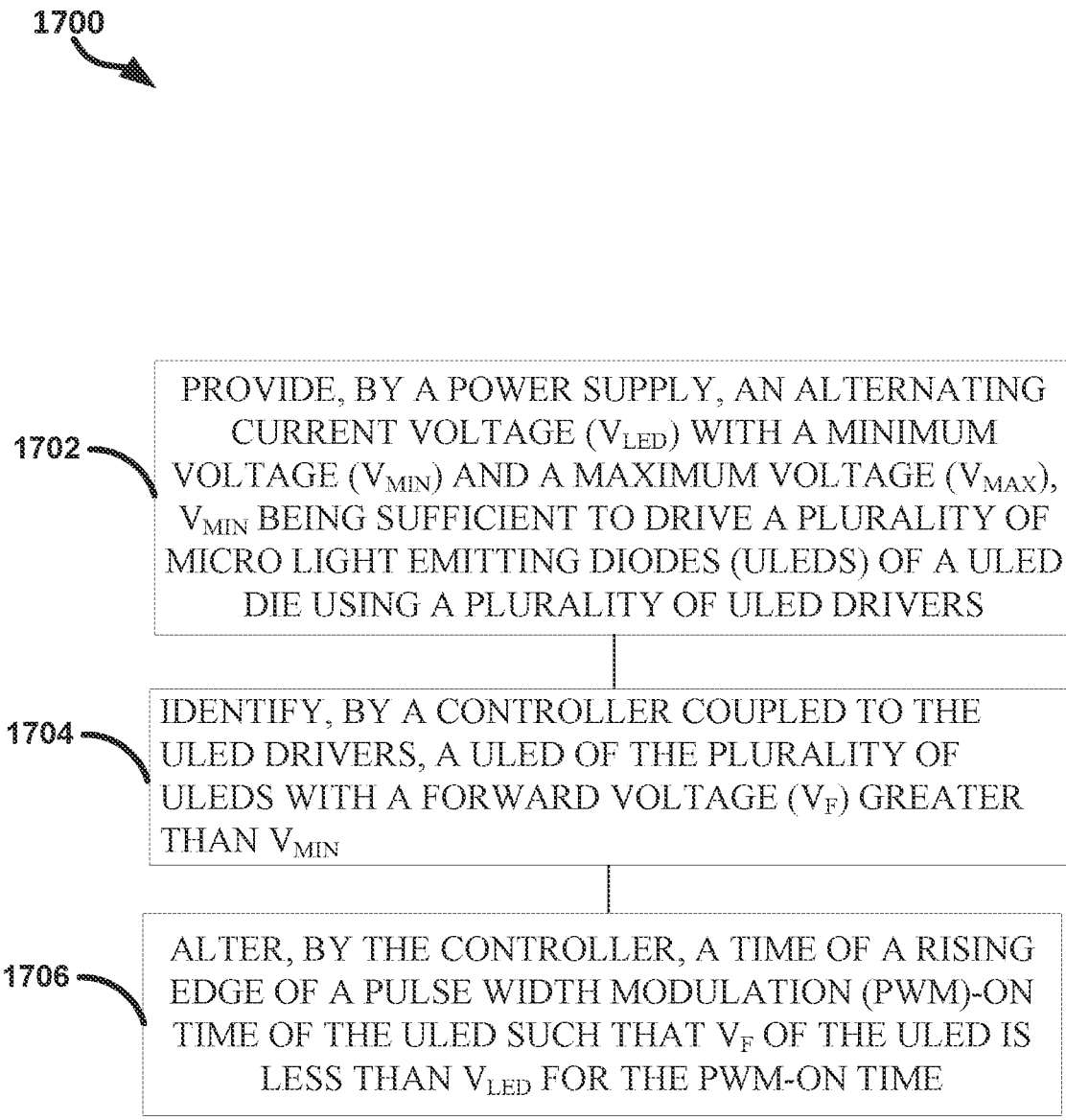
FIG. 17 illustrates, by way of example, a diagram of an embodiment of a method for driving a uLED matrix die.

FIG. 17 illustrates, by way of example, a diagram of an embodiment of a method 1700 for driving a uLED matrix die. The method 1700 can be performed, at least in part, by the voltage supply 102, the matrix of uLEDs 104, the controller 1660, driver 444, other component, or a combination thereof. The method 1700, as illustrated, includes providing, by a power supply, an alternating current voltage ($V_{LED}$) with a minimum voltage ($V_{MIN}$) and a maximum voltage ($V_{MAX}$), $V_{MIN}$ being sufficient to drive a plurality of micro light emitting diodes (uLEDs) of a uLED die using a plurality of uLED drivers, at operation 1702; identifying, by a controller coupled to the uLED drivers, a uLED of the plurality of uLEDs with a forward voltage ($V_f$) greater than $V_{MIN}$, at operation 1704; and altering, by the controller, a time of a rising edge of a pulse width modulation (PWM)-on time of the uLED such that $V_f$ of the uLED is less than $V_{LED}$ for the PWM-on time, at operation 1706.

The method 1700 can further include further identifying, by the controller, that the PWM on time of the uLED overlaps with a time at which the $V_{LED}$ is less than $V_f$ before altering the time of the rising edge. The method 1700 can further include identifying, by the controller, that an amount of time $V_f$ is less than $V_{LED}$ is less than the PWM on time. The method 1700 can further include reducing the PWM on time and increasing a peak current of a pixel driver at the uLED driver of the uLED. The method 1700 can further include causing, by the controller, $V_{MAX}$ and $V_{MIN}$ to increase in magnitude while maintaining a same frequency.

The method 1700 can further include identifying that the PWM on time of the uLED overlaps with a time at which the $V_{LED}$ is less than $V_f$ includes determining respective times corresponding to rising edge and falling edges of the PWM on time based on a duty cycle of the uLED. The method 1700 can further include, wherein identifying the time PWM on time of the uLED overlaps with a time at which the $V_{LED}$ is less than $V_f$ includes using a frequency and a reference time indicating a time at which $V_{LED}$ equals $V_{MAX}$ or $V_{MIN}$ to identify one of the time of the rising edge or the falling edge overlaps with the time at which the $V_{LED}$ is less than $V_f$. The method 1700 can further include, wherein a drive current of the uLED of the uLED die with $V_f$ greater than $V_{MIN}$ is modified such that an average drive current of the uLED is driven to a target average power.

What follows are some details regarding the matrix of uLEDs 104 and some application considerations followed by some examples.

Figure 18:
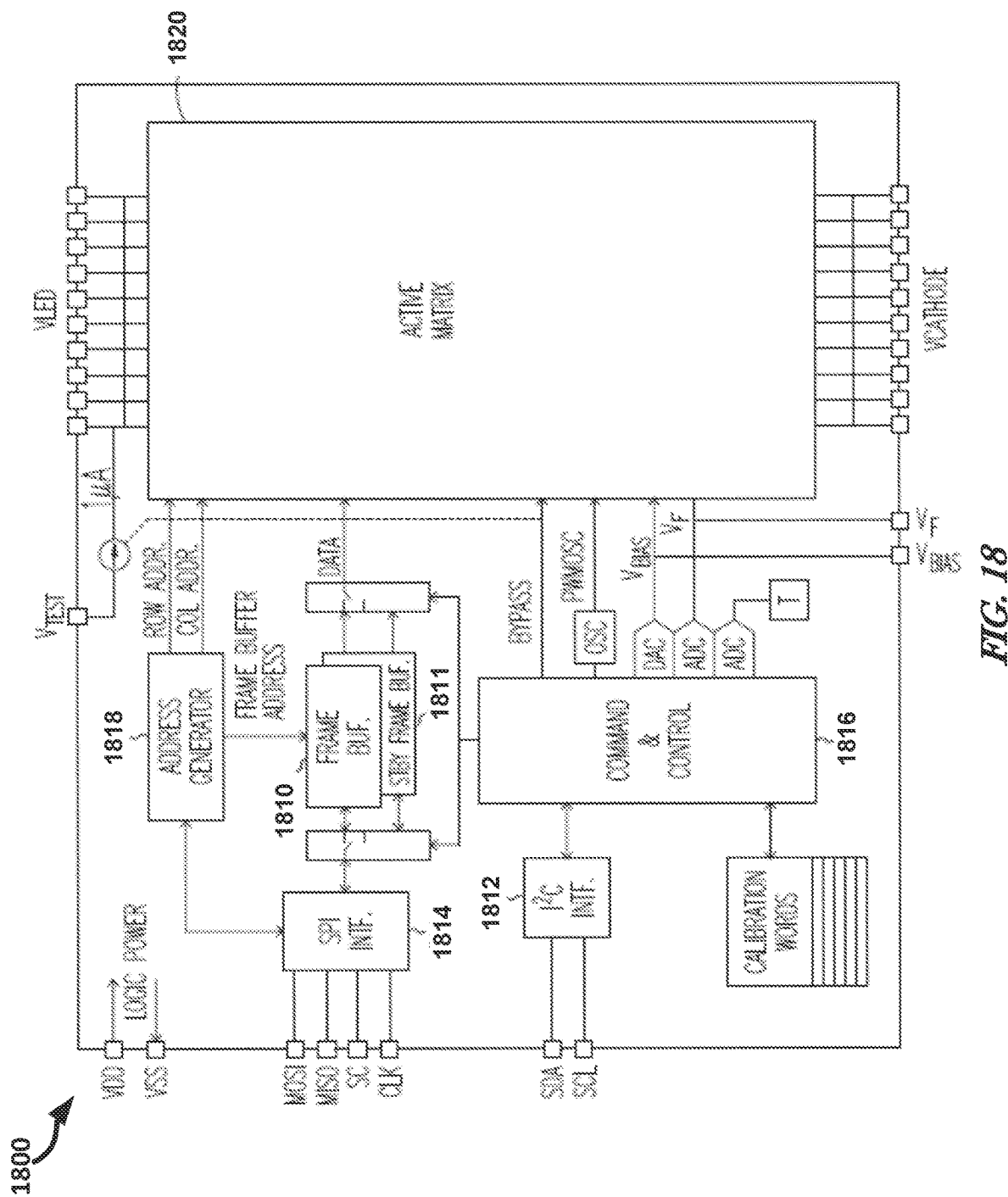
FIG. 18 illustrates in more detail an embodiment of a chip-level implementation of a system supporting functionality, such as discussed with respect to, for example, FIGS. 6-17.

FIG. 18 illustrates in more detail an embodiment of a chip-level implementation of a system 1800 supporting functionality, such as discussed with respect to, for example, FIGS. 6-17. The system 1800 includes a command and control module 1816 (sometimes called the controller, which may be similar to or the same as the controller 1660 of FIG. 16) able to implement pixel or group pixel level control of amplitude and duty cycle for circuitry and procedures such as discussed with respect to FIGS. 6-17 and elsewhere herein. In some embodiments, the system 1800 further includes a frame buffer 1810 for holding generated or processed images that can be supplied to the matrix of uLEDs 1820. Other modules can include digital control interfaces, such as (e.g., an Inter-Integrated Circuit (I²C) serial bus) or Serial Peripheral Interface (SPI) (1814), that are configured to transmit control data or instructions or response data.

In operation, system 1800 can accept image or other data from a vehicle or other source that arrives via the SPI interface 1814. Successive images or video data can be stored in an image frame buffer 1810. If no image data is available, one or more standby images held in a standby image buffer 1811 can be directed to the image frame buffer 1810. Such standby images can include, for example, an intensity and spatial pattern consistent with legally allowed low beam headlamp radiation patterns of a vehicle, or default light radiation patterns for architectural lighting or displays.

In operation, pixels in the images are used to define response of corresponding LED pixels in the active, with intensity and spatial modulation of LED pixels being based on the image(s). To reduce data rate issues, groups of pixels (e.g., 5×5 blocks) can be controlled as single blocks in some embodiments. In some embodiments, high speed and high data rate operation is supported, with pixel values from successive images able to be loaded as successive frames in an image sequence at a rate between 30 Hz and 100 Hz, with 60 Hz being typical. PWM can be used to control each pixel to emit light in a pattern and with an intensity at least partially dependent on the image held in the image frame buffer 1810.

In some embodiments, the system 1800 can receive logic power via $V_{dd}$ and $V_{ss}$ pins. An active matrix receives power for LED array control by multiple $V_{LED}$ and $V_{Cathode}$ pins. The SPI 1814 can provide full duplex mode communication using a master-slave architecture with a single master. The master device originates the frame for reading and writing. Multiple slave devices are supported through selection with individual slave select (SS) lines. Input pins can include a Master Output Slave Input (MOSI), a Master Input Slave Output (MISO), a chip select (SC), and clock (CLK), all connected to the SPI interface 1814. The SPI interface 1814 connects to an address generator, frame buffer, and a standby frame buffer. Pixels can have parameters set and signals or power modified (e.g. by power gating before input to the frame buffer, or after output from the frame buffer via pulse width modulation or power gating) by a command and control module. The SPI interface 1814 can be connected to an address generation module 1818 that in turn provides row and address information to the active matrix 1820. The address generation module 1818 in turn can provide the frame buffer address to the frame buffer 1810.

In some embodiments, the command and control module 1816 can be externally controlled via the serial bus 1812. A clock (SCL) pin and data (SDA) pin, such as with 7-bit addressing can be supported. The command and control module 1816 can include a digital to analog converter (DAC) and two analog to digital converters (ADC). The DAC and ADC are respectively used to set $V_{bias}$ for a connected active matrix, help determine maximum $V_f$ and determine system temperature. Also connected are an oscillator (OSC) to set the pulse width modulation oscillation (PWMOSC) frequency for the active matrix 1820. In one embodiment, a bypass line is also present to allow address of individual pixels or pixel blocks in the active matrix for diagnostic, calibration, or testing purposes. The active matrix 1820 can be further supported by row and column select that is used to address individual pixels, which are supplied with a data line, a bypass line, a PWMOSC line, a $V_{bias}$ line, and a $V_f$ line.

As will be understood by a person of ordinary skill in the art, in some embodiments the described circuitry and active matrix 1820 (similar to or same as the matrix of uLEDs 104) can be packaged and optionally include a submount or printed circuit board connected for powering and controlling light production by the semiconductor LED. In certain embodiments, the printed circuit board can also include electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount can act as a mechanical support, providing an electrical interface between electrodes on the LED and a power supply, and also provide heat sinking.

In some embodiments, the active matrix 1820 can be formed from light emitting elements of various types, sizes, and layouts. In one embodiment, one or two dimensional matrix arrays of individually addressable light emitting diodes (LEDs) can be used. Commonly N×M arrays where N and M are respectively between two and one thousand can be used. Individual LED structures can have a square, rectangular, hexagonal, polygonal, circular, arcuate or other surface shape. Arrays of the LED assemblies or structures can be arranged in geometrically straight rows and columns, staggered rows or columns, curving lines, or semi-random or random layouts. LED assemblies can include multiple LEDs formed as individually addressable pixel arrays are also supported. In some embodiments, radial or other non-rectangular grid arrangements of conductive lines to the LED can be used. In other embodiments, curving, winding, serpentine, and/or other suitable non-linear arrangements of electrically conductive lines to the LEDs can be used.

In some embodiments, arrays of microLEDs (μLEDs or uLEDs) can be used. uLEDs can support high density pixels having a lateral dimension less than 100 μm by 100 μm. In some embodiments, uLEDs with dimensions of about 50 μm in diameter or width and smaller can be used. Such uLEDS can be used for the manufacture of color displays by aligning, in close proximity, uLEDs comprising red, blue, and green wavelengths. In other embodiments, uLEDS can be defined on a monolithic gallium nitride (GaN) or other semiconductor substrate, formed on segmented, partially, or fully divided semiconductor substrate, or individually formed or panel assembled as groupings of uLEDs. In some embodiments, the active matrix 1120 can include small numbers of uLEDs positioned on substrates that are centimeter scale area or greater. In some embodiments, the active matrix 1120 can support uLED pixel arrays with hundreds, thousands, or millions of LEDs positioned together on centimeter scale area substrates or smaller. In some embodiments, uLEDS can include LEDs sized between 30 microns and 500 microns. In some embodiments, each of the light emitting pixels in the light emitting pixel array can be positioned at least 1 millimeter apart to form a sparse LED array. In other embodiments sparse LED arrays of light emitting pixels can be positioned less than 1 millimeter apart and can be spaced apart by distances ranging from 30 microns to 500 microns. The LEDs can be embedded in a solid or a flexible substrate, which can be at least in part transparent. For example, the light emitting pixel arrays can be at least partially embedded in glass, ceramic, or polymeric materials.

Light emitting matrix pixel arrays, such as discussed herein, may support applications that benefit from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated optics may be distinct at a pixel, pixel block, or device level. An example light emitting pixel array may include a device having a commonly controlled central block of high intensity pixels with an associated common optic, whereas edge pixels may have individual optics. Common applications supported by light emitting pixel arrays include video lighting, automotive headlights, architectural and area illumination, street lighting, and informational displays.

Light emitting matrix pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an application that may benefit from use of light emitting pixel arrays. A single light emitting array may be used to mimic various street light types, allowing, for example, switching between a Type I linear streetlight and a Type IV semicircular streetlight by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays are also suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Vehicle headlamps are a light emitting array application that requires large pixel numbers and a high data refresh rate. Automotive headlights that actively illuminate only selected sections of a roadway can used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

An LED light module can include matrix LEDS, alone or in conjunction with primary or secondary optics, including lenses or reflectors. To reduce overall data management requirements, the light module can be limited to on/off functionality or switching between relatively few light intensity levels. Full pixel level control of light intensity is not necessarily supported.

In operation, pixels in the images are used to define response of corresponding LED pixels in the pixel module, with intensity and spatial modulation of LED pixels being based on the image(s). To reduce data rate issues, groups of pixels (e.g. 5×5 blocks) can be controlled as single blocks in some embodiments. High speed and high data rate operation is supported, with pixel values from successive images able to be loaded as successive frames in an image sequence at a rate between 30 Hz and 100 Hz, with 60 Hz being typical. In conjunction with a pulse width modulation module, each pixel in the pixel module can be operated to emit light in a pattern and with intensity at least partially dependent on the image held in the image frame buffer.

Figure 19:
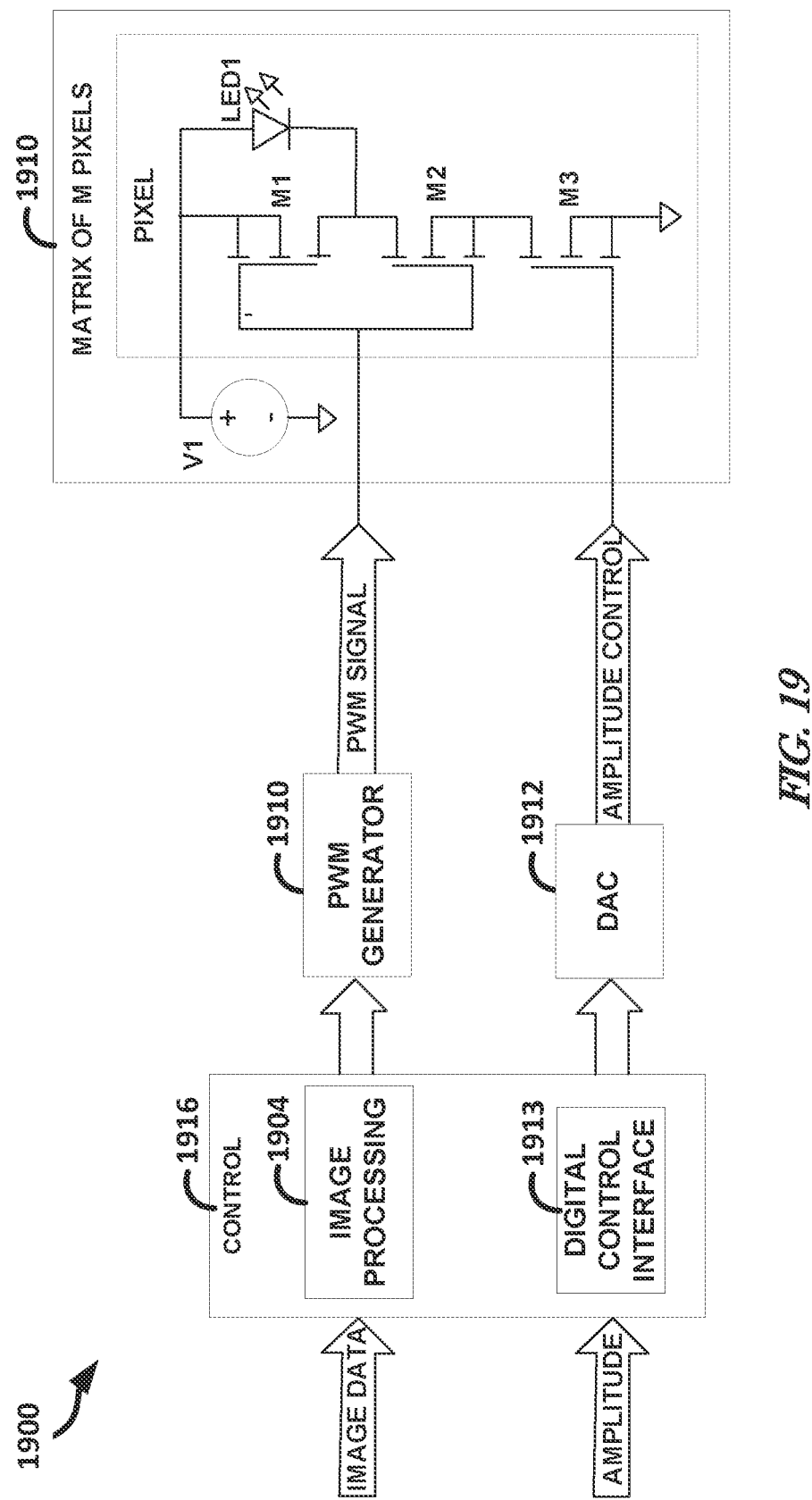
FIG. 19 illustrates, by way of example, a logical block diagram of a system that includes circuitry that can be included in a uLED package.

In the foregoing described embodiments, intensity of a uLED can be separately controlled and adjusted by setting appropriate ramp times and pulse width for each LED pixel using a suitable lighting logic, control module, and/or PWM module. Outlier pixel voltage management can provide LED pixel activation to provide reliable patterned lighting. A control system 1900 that can provide voltage supply 102 voltage management is illustrated in FIG. 19. As seen in FIG. 19, a matrix micro-LED array 1920 (similar to or same as the matrix of uLEDs 104) can contain one or more arrays of thousands to millions of microscopic LED pixels that actively emit light and are individually controlled. To emit light in a pattern or sequence that results in display of an image, the current levels of the micro-LED pixels at different locations on an array are adjusted individually according to a specific image. This can involve a PWM, which turns on and off the pixels at a certain frequency. During PWM operation, the average DC current through a pixel is the product of the electrical current amplitude and the PWM duty cycle, which is the ratio between the conduction time and the period or cycle time.

FIG. 19 illustrates, by way of example, a logical block diagram of a system 1900 that includes circuitry that can be included in a uLED package. Processing modules that facilitate efficient usage of the system 1900 are illustrated in FIG. 19. The system 1900 includes a control module 1916 (similar to or same as the control module 1816) able to implement pixel or group pixel level control of amplitude and duty cycle for circuitry and procedures such as discussed with respect to FIGS. 6-18. In some embodiments, the system 1900 further includes an image processing module 1904 to generate, process, or transmit an image, and digital control interfaces 1913, such as inter-integrated circuit (I$^2$C), serial peripheral interface (SPI), controller area network (CAN), universal asynchronous receiver transmitter (UART), or the like, that is configured to transmit control data and/or instructions. The digital control interfaces 1913 and control module 1916 may include a system microcontroller and any type of wired or wireless module configured to receive a control input from an external device. By way of example, a wireless module may include Bluetooth®, Zigbee, Z-wave, mesh, WiFi, near field communication (NFC) and/or peer to peer modules may be used. The microcontroller may be any type of special purpose computer or processor that may be embedded in an LED lighting system and configured or configurable to receive inputs from the wired or wireless module or other modules in the LED system and provide control signals to other modules based thereon. Algorithms implemented by the microcontroller or other suitable control module 1816 may be implemented in a computer program, software, or firmware incorporated in a non-transitory computer-readable storage medium for execution by the special purpose processor. Examples of non-transitory computer-readable storage mediums include a read only memory (ROM), a random access memory (RAM), a register, cache memory, and semiconductor memory devices. The memory may be included as part of the microcontroller or may be implemented elsewhere, either on or off a printed circuit or electronics board. Non-transitory does not mean incapable of motion (incapable of being in transit).

The term module, as used herein, may refer to electrical and/or electronic components disposed on individual circuit boards that may be soldered to one or more electronics boards. The term module may, however, also refer to electrical and/or electronic components that provide similar functionality, but which may be individually soldered to one or more circuit boards in a same region or in different regions.

The control module 1916 can further include the image processing module 1904 and the digital control interfaces 1913, such as I$^2$C. As will be appreciated, in some embodiments an image processing computation may be done by the control module 1916 through directly generating a modulated image. Alternatively, a standard image file can be processed or otherwise converted to provide modulation to match the image. Image data that mainly contains PWM duty cycle values can be processed for all pixels in image processing module 1904. Since amplitude is a fixed value or rarely changed value, amplitude related commands can be given separately through a simpler digital interface, such as I$^2$C. The control module 1916 interprets digital data, which can be used by PWM generator 1910 to generate PWM signals for pixels, and by Digital-to-Analog Converter (DAC) block 1912 to generate the control signals for obtaining the required current source amplitude.

In some embodiments, the active matrix 1920 in FIG. 19 can include m pixels including m common anode LEDs. In one example embodiment the pixel unit includes a single LED, LED1, and three transconductance devices (e.g., MOSFET) switches M1 through M3, and is supplied by the voltage supply V1 (sometimes called $V_{LED}$). M3 is an N-channel metal oxide semiconductor field effect transistor (MOSFET) whose gate is coupled to the amplitude control signal to generate the required current source amplitude. The P-channel MOSFET M1 is in parallel to LED1 and forms a totem pole pair with the N-channel MOSFET M2. The gates of the M1 and M2 transistor pair are tied together and coupled to the PWM signal. Therefore, when PWM is high, M1 will be turned off and M2 will be turned on. A current will flow through LED1, M2, and M3 with a value determined by the amplitude control signal coupled to M3 gate. When PWM is low, M1 will be turned on and M2 will be turned off. Consequently, the current source of M3 will be cut off and the LED will be fast discharged through M1.

Figure 20:
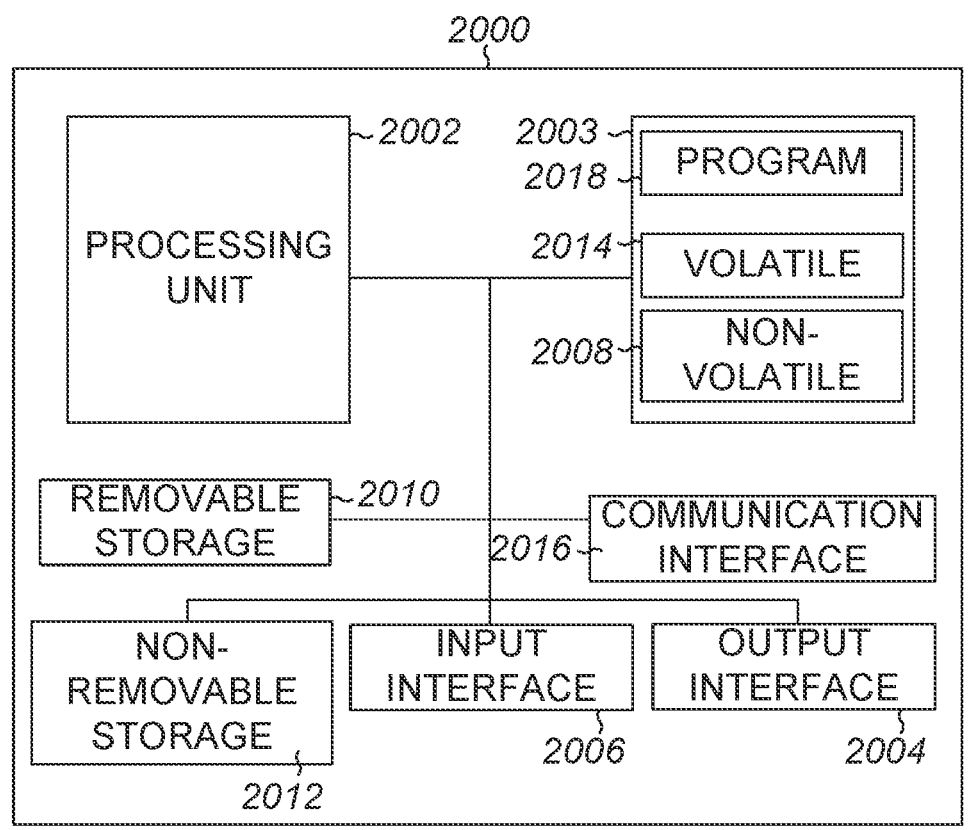
FIG. 20 illustrates, by way of example, a block diagram of an embodiment of a machine (e.g., a computer system) to implement one or more embodiments.

FIG. 20 illustrates, by way of example, a block diagram of an embodiment of a machine 2000 (e.g., a computer system) to implement one or more embodiments. The machine 2000 can implement a technique for managing underdriven or undriven uLEDs of a uLED die. The controller 1660, voltage supply 102, or a component thereof can include one or more of the components of the machine 2000. One or more of the controller 1660, voltage supply 102, or a component thereof can be implemented, at least in part, using a component of the machine 2000. One example machine 2000 (in the form of a computer), may include a processing unit 2002, memory 2003, removable storage 2010, and non-removable storage 2012. Although the example computing device is illustrated and described as machine 2000, the computing device may be in different forms in different embodiments. For example, the computing device may instead be a smartphone, a tablet, smartwatch, or other computing device including the same or similar elements as illustrated and described regarding FIG. 20. Devices such as smartphones, tablets, and smartwatches are generally collectively referred to as mobile devices. Further, although the various data storage elements are illustrated as part of the machine 2000, the storage may also or alternatively include cloud-based storage accessible via a network, such as the Internet.

Memory 2003 may include volatile memory 2014 and non-volatile memory 2008. The machine 2000 may include—or have access to a computing environment that includes—a variety of computer-readable media, such as volatile memory 2014 and non-volatile memory 2008, removable storage 2010 and non-removable storage 2012. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 2000 may include or have access to a computing environment that includes input 2006, output 2004, and a communication connection 2016. Output 2004 may include a display device, such as a touchscreen, that also may serve as an input device. The input 2006 may include one or more of a touchscreen, touchpad, mouse, keyboard, camera, one or more device-specific buttons, one or more sensors integrated within or coupled via wired or wireless data connections to the machine 2000, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 2002 (sometimes called processing circuitry) of the machine 2000. A hard drive, CD-ROM, and RAM are some examples of articles including a non-transitory computer-readable medium such as a storage device. For example, a computer program 2018 may be used to cause processing unit 2002 to perform one or more methods or algorithms described herein.

To further illustrate the apparatus and related method disclosed herein, a non-limiting list of examples is provided below. Each of the following non-limiting examples can stand on its own or can be combined in any permutation or combination with any one or more of the other examples.

In Example 1 a method includes providing, by a power supply, an alternating current voltage ($V_{LED}$) with a minimum voltage ($V_{MIN}$) and a maximum voltage ($V_{MAX}$), $V_{MIN}$ being sufficient to drive a plurality of micro light emitting diodes (uLEDs) of a uLED die using a plurality of uLED drivers, identifying, by a controller coupled to the uLED drivers, a uLED of the plurality of uLEDs with a forward voltage ($V_f$) greater than $V_{MIN}$, and altering, by the controller, a time of a rising edge of a pulse width modulation (PWM)-on time of the uLED such that $V_f$ of the uLED is less than $V_{LED}$ for the PWM-on time.

In Example 2, Example 1 can further include further identifying, by the controller, that the PWM on time of the uLED overlaps with a time at which the $V_{LED}$ is less than $V_f$ before altering the time of the rising edge.

In Example 3, at least one of Examples 1-2 can further include identifying, by the controller, that an amount of time $V_f$ is less than $V_{LED}$ is less than the PWM on time.

In Example 4, Example 3 can further include reducing the PWM on time and increasing a peak current of a pixel driver at the uLED driver of the uLED.

In Example 5, at least one of Examples 3-4 can further include causing, by the controller, $V_{MAX}$ and $V_{MIN}$ to increase in magnitude while maintaining a same frequency.

In Example 6, at least one of Examples 1-5 can further include, wherein identifying that the PWM on time of the uLED overlaps with a time at which the $V_{LED}$ is less than $V_f$ includes determining respective times corresponding to rising edge and falling edges of the PWM on time based on a duty cycle of the uLED.

In Example 7, Example 6 can further include, wherein identifying the time PWM on time of the uLED overlaps with a time at which the $V_{LED}$ is less than $V_f$ includes using a frequency and a reference time indicating a time at which $V_{LED}$ equals $V_{MAX}$ or $V_{MIN}$ to identify one of the time of the rising edge or the falling edge overlaps with the time at which the $V_{LED}$ is less than $V_f$.

In Example 8, at least one of Examples 1-7 can further include, wherein a drive current of the uLED of the uLED die with $V_f$ greater than $V_{MIN}$ is modified such that an average drive current of the uLED is driven to a target average power.

Example 9 includes a system comprising a power supply configured to provide an alternating current voltage ($V_{LED}$) with a minimum voltage ($V_{MIN}$) and a maximum voltage ($V_{MAX}$), $V_{MIN}$ sufficient to drive a majority of micro light emitting diodes (uLEDs) of a uLED die using uLED drivers of the uLED die, and a controller coupled to the uLED drivers, the controller configured to identify a uLED of the uLEDs with a forward voltage ($V_f$) greater than $V_{MIN}$ and alter a time of a rising edge of a pulse width modulation (PWM) on time of the uLED such that $V_f$ of the uLED is less than $V_{LED}$ for the PWM on time.

In Example 10, Example 9 can further include, wherein the controller is further configured to identify that the PWM on time of the uLED overlaps with a time at which the $V_{LED}$ is less than $V_f$ before altering the time of the rising edge.

In Example 11, at least one of Examples 9-10 can further include, wherein the controller is further configured to identify that an amount of time $V_f$ is less than $V_{LED}$ is less than the PWM on time.

In Example 12, Example 11 can further include, wherein the controller is further configured to reduce the PWM on time and increasing a peak current of a pixel driver at the uLED driver of the uLED.

In Example 13, at least one of Examples 11-12 can further include, wherein the controller is further configured to cause $V_{MAX}$ and $V_{MIN}$ to increase in magnitude while maintaining a same frequency.

In Example 14, at least one of Examples 9-13 can further include, wherein identifying that the PWM on time of the uLED overlaps with a time at which the $V_{LED}$ is less than $V_f$ includes determining respective times corresponding to rising edge and falling edges of the PWM on time based on a duty cycle of the uLED.

In Example 15, Example 14 can further include, wherein identifying the time PWM on time of the uLED overlaps with a time at which the $V_{LED}$ is less than $V_f$ includes using a frequency and a reference time indicating a time at which $V_{LED}$ equals $V_{MAX}$ or $V_{MIN}$ to identify one of the time of the rising edge or the falling edge overlaps with the time at which the $V_{LED}$ is less than $V_f$.

Example 16 includes a machine-readable medium including instructions that, when executed by a machine, cause the machine to perform operations comprising providing an alternating current voltage ($V_{LED}$) with a minimum voltage ($V_{MIN}$) and a maximum voltage ($V_{MAX}$), $V_{MIN}$ sufficient to drive a majority of micro light emitting diodes (uLEDs) of a uLED die using uLED drivers of the uLED die, identifying a uLED of the uLEDs with a forward voltage ($V_f$) greater than $V_{MIN}$, and altering a time of a rising edge of a pulse width modulation (PWM) on time of the uLED such that $V_f$ of the uLED is less than $V_{LED}$ for the PWM on time.

In Example 17, Example 16 can further include, wherein the operations further comprise further identifying that the PWM on time of the uLED overlaps with a time at which the $V_{LED}$ is less than $V_f$ before altering the time of the rising edge.

In Example 18, at least one of Examples 16-17 can further include wherein the operations further comprise identifying that an amount of time $V_f$ is less than $V_{LED}$ is less than the PWM on time.

In Example 19, Example 18 can further include, wherein the operations further comprise reducing the PWM on time and increasing a peak current of a pixel driver at the uLED driver of the uLED.

In Example 20, at least one of Examples 18-19 can further include, wherein the operations further comprise causing $V_{MAX}$ and $V_{MIN}$ to increase in magnitude while maintaining a same frequency.

While example embodiments of the present disclosed subject matter have been shown and described herein, it will be obvious to those skilled in the art that such embodiments are provided by way of example only. Numerous variations, changes, and substitutions will now occur to those skilled in the art, upon reading and understanding the material provided herein, without departing from the disclosed subject matter. It should be understood that various alternatives to the embodiments of the disclosed subject matter described herein may be employed in practicing the various embodiments of the subject matter. It is intended that the following claims define the scope of the disclosed subject matter and that methods and structures within the scope of these claims and their equivalents be covered thereby.

What is claimed is:

1. A method comprising:
providing, by a power supply, an alternating current voltage ($V_{LED}$) with a minimum voltage ($V_{MIN}$) and a maximum voltage ($V_{MAX}$), $V_{MIN}$ being sufficient to drive a plurality of micro light emitting diodes (uLEDs) of a uLED die using a plurality of uLED drivers;
identifying, by a controller coupled to the uLED drivers, a uLED of the plurality of uLEDs with a forward voltage ($V_f$) greater than $V_{MIN}$; and
altering, by the controller, a time of a rising edge of a pulse width modulation (PWM)-on time of the uLED such that $V_f$ of the uLED is less than $V_{LED}$ for the PWM-on time.

2. The method of claim 1, further comprising further identifying, by the controller, that the PWM on time of the uLED overlaps with a time at which the $V_{LED}$ is less than $V_f$ before altering the time of the rising edge.

3. The method of claim 1, further comprising identifying, by the controller, that an amount of time $V_f$ is less than $V_{LED}$ is less than the PWM on time.

4. The method of claim 3, further comprising, reducing the PWM on time and increasing a peak current of a pixel driver at the uLED driver of the uLED.

5. The method of claim 3, further comprising causing, by the controller, $V_{MAX}$ and $V_{MIN}$ to increase in magnitude while maintaining a same frequency.

6. The method of claim 1, wherein identifying that the PWM on time of the uLED overlaps with a time at which the $V_{LED}$ is less than $V_f$ includes determining respective times corresponding to rising edge and falling edges of the PWM on time based on a duty cycle of the uLED.

7. The method of claim 6, wherein identifying the time PWM on time of the uLED overlaps with a time at which the $V_{LED}$ is less than $V_f$ includes using a frequency and a reference time indicating a time at which $V_{LED}$ equals $V_{MAX}$ or $V_{MIN}$ to identify one of the time of the rising edge or the falling edge overlaps with the time at which the $V_{LED}$ is less than $V_f$.

8. The method of claim 1, wherein a drive current of the uLED of the uLED die with $V_f$ greater than $V_{MIN}$ is modified such that an average drive current of the uLED is driven to a target average power.

9. A system comprising:
a power supply configured to provide an alternating current voltage ($V_{LED}$) with a minimum voltage ($V_{MIN}$) and a maximum voltage ($V_{MAX}$), $V_{MIN}$ sufficient to drive a majority of micro light emitting diodes (uLEDs) of a uLED die using uLED drivers of the uLED die; and
a controller coupled to the uLED drivers, the controller configured to:
identify a uLED of the uLEDs with a forward voltage ($V_f$) greater than $V_{MIN}$ and alter a time of a rising edge of a pulse width modulation (PWM) on time of the uLED such that $V_f$ of the uLED is less than $V_{LED}$ for the PWM on time.

10. The system of claim 9, wherein the controller is further configured to identify that the PWM on time of the uLED overlaps with a time at which the $V_{LED}$ is less than $V_f$ before altering the time of the rising edge.

11. The system of claim 9, wherein the controller is further configured to identify that an amount of time $V_f$ is less than $V_{LED}$ is less than the PWM on time.

12. The system of claim 11, wherein the controller is further configured to reduce the PWM on time and increasing a peak current of a pixel driver at the uLED driver of the uLED.

13. The system of claim 11, wherein the controller is further configured to cause $V_{MAX}$ and $V_{MIN}$ to increase in magnitude while maintaining a same frequency.

14. The system of claim 9, wherein identifying that the PWM on time of the uLED overlaps with a time at which the $V_{LED}$ is less than $V_f$ includes determining respective times corresponding to rising edge and falling edges of the PWM on time based on a duty cycle of the uLED.

15. The system of claim 14, wherein identifying the time PWM on time of the uLED overlaps with a time at which the $V_{LED}$ is less than $V_f$ includes using a frequency and a reference time indicating a time at which $V_{LED}$ equals $V_{MAX}$ or $V_{MIN}$ to identify one of the time of the rising edge or the falling edge overlaps with the time at which the $V_{LED}$ is less than $V_f$.

16. A machine-readable medium including instructions that, when executed by a machine, cause the machine to perform operations comprising:

provicing an alternating current voltage ($V_{LED}$) with a minimum voltage ($V_{MIN}$) and a maximum voltage ($V_{MAX}$), $V_{MIN}$ sufficient to drive a majority of micro light emitting diodes (uLEDs) of a uLED die using uLED drivers of the uLED die;

identifying a uLED of the uLEDs with a forward voltage ($V_f$) greater than $V_{MIN}$; and altering a time of a rising edge of a pulse width modulation (PWM) on time of the uLED such that $V_f$ of the uLED is less than $V_{LED}$ for the PWM on time.

17. The machine-readable medium of claim 16, wherein the operations further comprise further identifying that the PWM on time of the uLED overlaps with a time at which the $V_{LED}$ is less than $V_f$ before altering the time of the rising edge.

18. The machine-readable medium of claim 16, wherein the operations further comprise identifying that an amount of time $V_f$ is less than $V_{LED}$ is less than the PWM on time.

19. The machine-readable medium of claim 18, wherein the operations further comprise reducing the PWM on time and increasing a peak current of a pixel driver at the uLED driver of the uLED.

20. The machine-readable medium of claim 18, wherein the operations further comprise causing $V_{MAX}$ and $V_{MIN}$ to increase in magnitude while maintaining a same frequency.

* * * * *